United States Patent
Arai et al.

(10) Patent No.: US 7,700,403 B2
(45) Date of Patent: Apr. 20, 2010

(54) MANUFACTURING METHOD OF SEMICONDUCTOR DEVICE

(75) Inventors: Tadashi Arai, Kumagaya (JP); Shinichi Saito, Kawasaki (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 12/320,201

(22) Filed: Jan. 21, 2009

(65) Prior Publication Data
US 2009/0215222 A1 Aug. 27, 2009

(30) Foreign Application Priority Data
Feb. 22, 2008 (JP) .............................. 2008-041449

(51) Int. Cl.
H01L 51/40 (2006.01)
H01L 21/312 (2006.01)
(52) U.S. Cl. .................. 438/99; 438/149; 257/E21.259
(58) Field of Classification Search .................... 438/99, 438/149
See application file for complete search history.

(56) References Cited

U.S. PATENT DOCUMENTS 7,626,200 B2 * 12/2009 Tayanaka ...................... 257/59

| 2003/0211662 | A1 * | 11/2003 | Yamazaki et al. | ............ 438/142 |
| 2005/0046761 | A1 * | 3/2005 | Fukuhara et al. | .............. 349/38 |
| 2006/0216872 | A1 | 9/2006 | Arai et al. | |
| 2007/0178616 | A1 | 8/2007 | Arai et al. | |
| 2007/0281384 | A1 | 12/2007 | Arai et al. | |
| 2009/0085025 | A1 * | 4/2009 | Arai et al. | ...................... 257/4 |

FOREIGN PATENT DOCUMENTS

JP 2004-349292 5/2003
JP 2006-269709 3/2005

* cited by examiner

*Primary Examiner*—Alexander G Ghyka
(74) *Attorney, Agent, or Firm*—Stites & Harbison PLLC; Juan Carlos A. Marquez, Esq.

(57) ABSTRACT

When a thin film transistor is manufactured by using a printing method, the precision of alignment between a first electrode and a second electrode becomes a problem. If it is manufactured by using photolithography, a photomask for each layer is necessary, resulting in the cost being increased. The essence of the present invention is that not only processing the gate shape is carried out over the substrate by using a resist pattern formed by exposing using a photo-mask for the gate pattern but also processing the source-drain electrodes is carried out by lifting-off. As a result, alignment between the source-drain electrode and the gate electrode is carried out.

17 Claims, 25 Drawing Sheets

MANUFACTURING METHOD OF SEMICONDUCTOR DEVICE

CLAIM OF PRIORITY

The present application claims priority from Japanese patent application JP 2008-041449 filed on Feb. 22, 2008, the content of which is hereby incorporated by reference into this application.

FIELD OF INVENTION

The present invention relates to a manufacturing method of a semiconductor device including a thin film transistor (TFT) which uses an organic semiconductor material and an oxide semiconductor material and, specifically, relates to a manufacturing method of a semiconductor device which is able to align a first electrode with a pair of second and third electrodes by using one photomask.

BACKGROUND OF THE INVENTION

Conventionally, in a method of forming a film while forming an organic thin film transistor (organic TFT), there has been a method which combines the advantage of photolithography with the advantage of a printing method as a means to avoid the problem of the misalignment of various patterns in the case of forming by a printing method (for example, refer to JP-A-2006-269709).

Moreover, as a method of forming a TFT using an organic semiconductor material, there has been one which processes the gate insulator by performing gate patterning and oxidizing (for example, refer to JP-A-2004-349292).

SUMMARY OF THE INVENTION

Recently, there has been a variety of research and development carried out on display devices which include a thin film transistor (TFT: Thin Film Transistor) device. Since this TFT has low power consumption and is space-saving, it is beginning to be used as a transistor for driving a display device of portable devices such as cellular phones, notebook computers, and PDAs. Such a TFT is mainly manufactured of an inorganic semiconductor material typified by crystalline silicon and amorphous silicon. This is due to the fact that it can be manufactured by using a conventional manufacturing process and manufacturing technology for semiconductor devices. However, when a semiconductor manufacturing process is used, the substrate which can be used is limited because the treatment temperature thereof becomes 350° C. or more. Specifically, there are many flexible substrates that are represented by a plastic having a heat-resistant temperature of 200° C. or less, so that it is difficult to manufacture a TFT including an inorganic semiconductor material by using a conventional manufacturing process of a semiconductor.

Recently, in order to solve this problem, there has been progress in the research and development of TFT devices (hereinafter, it is made a generic term including an organic TFT and an oxide TFT) using an organic semiconductor material and an organic semiconductor material which can be manufactured at low temperatures. Since the organic semiconductor film can be formed at low temperatures, the organic TFT and the oxide TFT can be formed over a substrate having low heat resistance such as a plastic. Therefore, a flexible new device which is not conventional can be manufactured.

As a manufacturing process of the film for forming the organic TFT, an appropriate method is selected depending on the material from a coating-printing method, a spin-coating method, a spray coating method, a transfer method, an evaporation method, a dip coating method, and a casting method. For instance, in the case of the organic semiconductor material, a low molecular weight compound such as a pentacene derivative, etc. is deposited by an evaporation method, etc. and a polymer compound such as a polythiophene derivative, etc. is formed from a solution. When it is formed by a printing method, there is a problem of misalignment of a variety of patterns and the resolution is about 20 μm in printing. If this is the extent of the resolution, a parasitic capacitance occurs between the electrodes. As a means to avoid this, there is an example relating to a manufacturing method of a semiconductor device which has an organic thin film transistor and, for instance, the above mentioned JP-A-2006-269709 is involved. In this example, the advantage of photolithography and the advantage of a printing method are combined.

Recently, the channel part of a TFT is manufactured with a small amount of organic semiconductor material without waste by using a coating-printing process typified by an ink-jet, a micro-dispenser, and a transfer method, thereby, research and development have been carried out to pursue a further reduction in cost. Additionally, research and development has already started in which the electrode and the wiring part are also manufactured by a coating-printing method. Moreover, various reports of a combination of the gate material and the gate insulator have been disclosed. For instance, the aforementioned JP-A-2004-349292 has been reported as an example where processing of the gate insulator is carried out by performing gate patterning and oxidizing.

As mentioned above, although there is a method including so-called underside exposure in order to compensate for the disadvantage of the coating-printing technology, this method needs a transparent substrate and a transparent gate insulator in this method. There is a limitation to these materials. For instance, there is a case where the transparency of each of the aforementioned materials does not meet the exposure wavelength of a commercial photosensitive material. In this case, the development of the photosensitive material becomes necessary, which matches the transparency. Therefore, it generally becomes a photolithography which uses a plurality of photo-masks. Consequently, the low-cost advantage of printing can not be realized and the cost becomes high rapidly.

In order to reduce the number of masks, a method where the gate insulator is made by oxidizing is also disclosed as in the case of the aforementioned JP-A-2004-349292. However, even in this method, a mask is necessary for each layer to perform photolithography on all other materials, so that there is only a reduction by one mask for processing the gate insulator.

In the face of such problems as these, it is an objective of the present invention to provide a manufacturing method of a high performance TFT by using a coating-printing method where the first electrode and the second and third electrodes are aligned over the substrate.

The present invention is one achieving the alignment between the first electrode and a pair of second and third electrodes by using one photomask. Therefore, the present invention is extremely useful for manufacturing a field effect transistor including a thin film semiconductor layer. Moreover, the present invention is able to provide a manufacturing method of a high performance TFT by using a photolithography technology and a coating or printing method, for example, over a flexible substrate.

(1) A basic mode of the present invention is as follows. That is, it is a manufacturing method of a semiconductor device including, the step of stacking a first conductor and a first insulator over a substrate, the step of forming a photoresist film over the stacked film, the step of processing the photoresist film corresponding to the first electrode, the step of processing the stacked film of the first conductor and the first insulator to be the stacked film of the first electrode and the first insulator by using the processed photoresist film, the step of forming a second insulator over a pair of sidewalls of the first electrode, the step of forming the second conductor (electrode material film) for the second and third electrodes by coating (or printing) over the sides of the second insulator formed over the pair of sidewalls, and over the stacked film of the first electrode and the first insulator, the step of forming the second and third electrodes by removing the photoresist film over the first insulator and removing the second conductor for the second and third electrodes over the first insulator, and the step of forming a semiconductor material which touches the second and third electrodes and covers the first insulator by coating (coating including printing). In this specification, the term "coating" is used as an inclusive meaning which includes printing. These concrete methods thereof are described later. Specifically, the amount of material used can be suppressed in the requirements for a pattern by using a printing method.

The second mode of this invention is specifically a mode where a field-effect TFT is manufactured. That is, it is a manufacturing method of a semiconductor device in which the first electrode is a gate electrode, the second and third electrodes are source and drain electrodes, respectively, and the first insulator is a gate insulator.

The third mode of this invention is a manufacturing method of a semiconductor device in which the step of stacking the first conductor and the insulator is one where the first conductor is formed by anodic oxidation.

The fourth mode of this invention is a manufacturing method of a semiconductor device of the first mode in which the step of forming the second insulator over a pair of sidewalls of the first electrode is one where a pair of sidewalls of the first electrode is formed by anodic oxidation.

It is naturally possible and useful to match suitably and to perform these second, third, and fourth modes. Herein, when anodization is used for formation of an oxide film, it is needless to say that a treatment of anti-oxidation has to be done on the part where oxidation by this anodization creates a problem, for instance, a contact part, etc. The condition is the same in the various modes of the present invention. In the following third embodiment, a concrete example will be shown.

Moreover, the present invention can be applied to various specific modes according to the circuit structure of the semiconductor device. If an example where the semiconductor device is arranged in a matrix and an example where two semiconductor devices are connected to each other are illustrated, they are as follows.

That is, the former has a mode in which a plurality of semiconductor devices are arranged in the matrix, consisting of a combination of the first electrode, the first insulator thereon, the second insulator formed over a pair of sides of the first electrode, and the second and third electrodes provided over both sides, and the semiconductor film which touches the second and third electrodes and is provided to cover the first insulator.

And, in this case, the first electrode of each semiconductor device in the line or column arranged in the matrix is connected using the wire to be the first conductor and, after the step of forming the second and third electrodes in the basic steps, it is useful to apply a step of connecting the second or third electrode with the third conductor in each semiconductor device in the line or column arranged in the matrix. It is practical that the third conductor be formed in the same method as the aforementioned second conductor.

Furthermore, the latter has a mode in which at least two semiconductor devices are arranged in the matrix, consisting of a combination of the first electrode, the first insulator thereon, the second insulator formed over a pair of sides of the first electrode, and the second and third electrodes provided over both sides, and the semiconductor film which touches the second and third electrodes and is provided to cover the first insulator.

Moreover, in this case, it is useful to apply the step of forming the fourth conductor connected to the stacked film of the first semiconductor device in the two aforementioned semiconductor devices after the step of processing the stacked film of the first electrode and the first insulator in the aforementioned basic steps; and it is useful to apply the step of forming the fourth conductor connected to the first semiconductor device in the two aforementioned semiconductor devices and the step of forming the fifth conductor connected to the second or third electrode of the second semiconductor device in the two aforementioned semiconductor devices after the step of forming the second and third electrodes. It is practical that the formation of the fourth conductor is done by using a method similar to the above-mentioned second conductor.

Concrete examples of both will be described later.

An organic semiconductor material is a typical example of the semiconductor material which is coated (specifically, coating includes printing). More concrete examples will be described later. Moreover, the present invention can use an oxide semiconductor material or a silicon-containing semiconductor material, etc. as the semiconductor material.

One or a plurality of kinds of coating methods (specifically, coating includes printing) selected from an inkjet method, a micro-dispensing method, a transfer method, a screen coating and printing method, a slit coating method, a spray coating method, a capillary coating method, a dip-coating method, and a spin-coating method can be used.

FIG. 1 is a process flow chart illustrating a typical concrete mode of manufacturing a TFT of the present invention. The main point is that a material of the first conductor (gate film in this example) which is able to be anodized is deposited over the substrate and the surface is anodized, resulting in the first insulator being formed. A resist is coated thereon, and the resist is processed to be a gate pattern shape by using photolithography. The first insulator (anodization film in this example) and the first conductor (gate film in this example) are processed by using the pattern. Then, the source-drain material is coated on the required part by printing. It is lifted off by using the remaining gate pattern resist. As a result, a high performance TFT without misalignment of the first electrode (gate electrode in this example) and a pair of second and third electrodes (source-drain electrodes in this example) can be manufactured by printing the semiconductor material on the gate. More concretely, it will be described in the following column "DETAILED DESCRIPTION OF THE PREFERRED EMBODIMENT".

According to the present invention, processing for alignment between the first electrode and a pair of second and third electrodes can be achieved by only using one photomask.

BRIEF DESCRIPTION OF THE DRAWINGS

FIG. 10B is a cross-sectional view at the line A-A' in the plane view of FIG. 10A illustrating in order of a manufacturing process of the semiconductor device including the transistor of the second embodiment of the present invention;

DETAILED DESCRIPTION OF THE PREFERRED EMBODIMENTS

Before concretely explaining the various modes of the present invention, the main mode of the present invention and concrete materials to be used, etc. will be further described.

If the main point of the present invention is explained by using a concrete example of a TFT, it is as follows. That is, not only the processing of the gate but also the processing of the source-drain electrodes is performed over the predetermined substrate by lifting off using a resist pattern formed by exposure with a photomask for the gate pattern. A combination of the source-drain electrodes and the gate electrode is performed. In this case, it is useful for a TFT to use a flexible substrate and it becomes possible to use the TFT more broadly.

Figure 1:
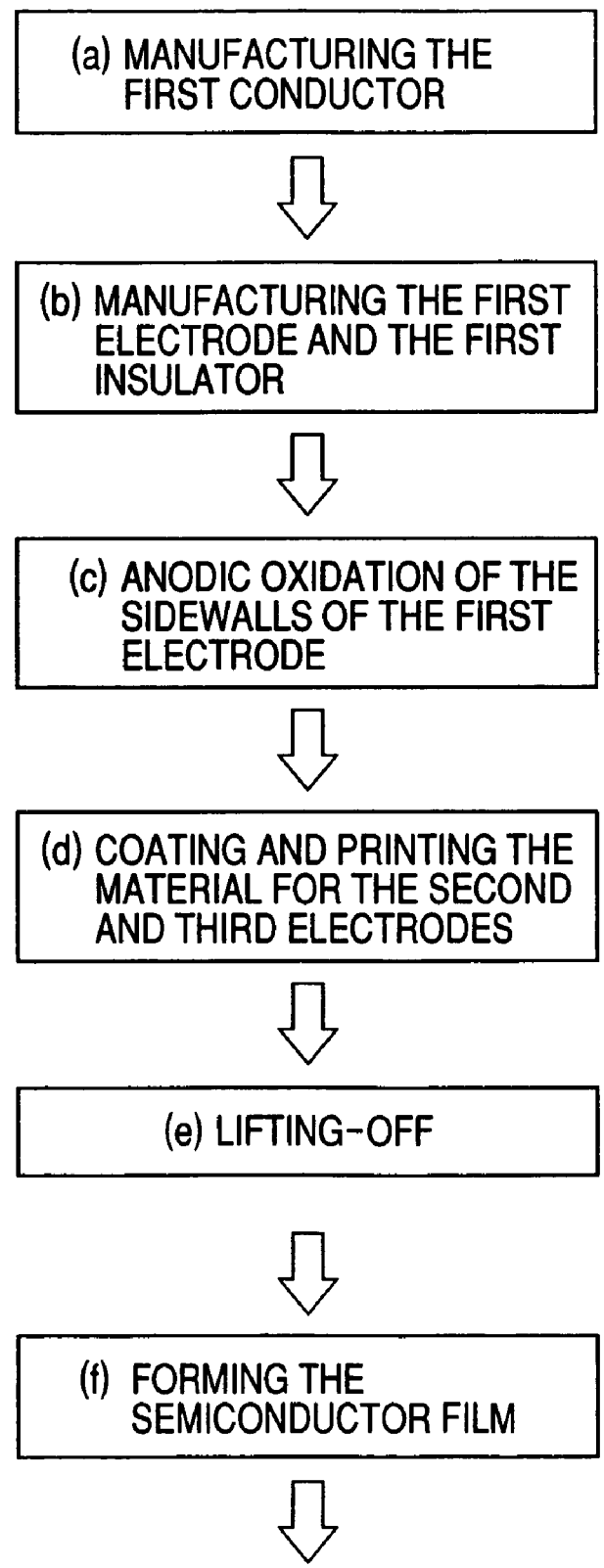
FIG. 1 is a drawing illustrating a process flow for forming a transistor in accordance with the present invention.

A typical flow of a manufacturing process of a TFT is the process shown in the above-mentioned FIG. 1.

(a) in FIG. 1

(1) A step of stacking a first conductor (the material film of the gate electrode) and a first insulator (to be the gate insulator alter processing). It is practical and preferable that the first insulator of this step be formed by anodizing the surface of the first conductor.

(b) in FIG. 1

(2) A step of forming a photoresist film thereon and processing the desired shape (when it is a TFT, it is the shape of the gate electrode). This processing is usually performed by exposure and development using the photomask.

In order to improve the performance of a TFT, it is preferable to process the photoresist film by patterning. That is, high-precision processing of the fundamental shape in the present invention is possible. Both a positive type and a negative type can be theoretically used as the photoresist for the aforementioned resist pattern. In general, from the viewpoint of ease of resist-removal, the positive type is preferable for the purpose of the present invention.

(3) By using the processed photoresist pattern, the stacked film of the first conductor and the first insulator is processed to be the stacked film of the first electrode (it corresponds to the gate electrode in the case of a TFT) and the first insulator (it corresponds to the gate insulator in the case of a TFT).

(c) in FIG. 1

(4) A step of forming the second insulator over a pair of the sidewalls opposite the first electrode.

The second insulator is intended to be the insulation between the first electrode and the second and third electrodes (in the case of a TFT, it corresponds to the source electrode and the drain electrode) formed in the following step.

Formation of the second insulator over a pair of sidewalls opposite the first electrode can use the formation of an oxide film by anodization, the formation of the insulator by coating, and others. It is preferably practical that the second insulator be formed over a pair of sidewalls opposite the first electrode by anodizing the first electrode. It is sufficient that the procedure of anodization itself be a customary procedure. That is, it is carried out by placing a metallic part, which is intended to be anodized, opposite a counter electrode (a Pt electrode is generally used) in a solution for anodization, applying a voltage, and allowing current to flow.

In this anodization method it is not necessary to heat-up the substrate etc. Therefore, a substrate material with a comparatively low heat-resistance, for instance, one of an organic polymer material such as a plastic substrate, etc. can be used. Therefore, the present invention makes it possible to use, for instance, a flexible substrate.

(d) in FIG. 1

(5) A step of forming the pattern by coating (that is, coating including printing) the material for the second and third electrodes over the second and third electrode region and the first electrode pattern region.

(e) in FIG. 1

(6) A step of removing the photoresist over the first electrode and removing the material for the second and third electrodes over the first electrode. This step is called lift-off. As a result, the second and third electrodes (source-drain electrodes in a TFT) are formed.

(f) in FIG. 1

(7) A step of coating or printing the semiconductor material layer which is able to be coated (that is, coating including printing) between the second and third electrodes (between the source-drain electrodes). Naturally, a heat-treatment is performed, which is determined depending on each semiconductor material. This semiconductor layer becomes the base material of the semiconductor device.

Thus, the alignment becomes possible by using only one mask for the pattern formation between the first electrode (in the case of a TFT, it corresponds to the gate electrode) and the second and third electrodes (in the case of a TFT, it corresponds to the source-drain electrodes).

The typical examples of the coating method (that is, coating including printing) is an inkjet method, a micro-dispensing method, a transfer method, a screen coating and printing method, a slit coating method, a spray coating method, a capillary coating method, a dip-coating method, and a spin-coating method. For the purpose of the present invention, it is practical to use at least one of these for the formation of various parts.

Next, the concrete materials, etc. used for the present invention will be explained.

The typical example of the flexible substrate is a metallic thin film sheet, and a flexible plastic sheet, a so-called plastic film. In the case of a metallic thin film sheet, it is necessary that the insulation treatment be done on the surface thereof in order to apply it to the device formation. As a plastic film, polyethylene terephthalate, polyethylene naphthalate, polyetherimide, polyethersulfone, polyether ether ketone, polyphenylene sulfide, polyacrylate, polyimide, polycarbonate, cellulose triacetate, and cellulose acetate propionate, etc. are listed as the examples. As described above, the plastic film has the feature of bending flexibility. It has an advantage in various applications where its flexible feature is required for the device. Moreover, the formation of a printing pattern may be supported by performing the treatment on these substrate surfaces. When a metallic substrate is used, an insulation coating is applied over the surface of the metal. For instance, an insulation coating is applied over the surface of an aluminum substrate and a stainless steel substrate.

As the first electrode material (the gate electrode material in a TFT), a metal, notably aluminum and tantalum, which is possible to be anodized can be selected.

Moreover, as the second and third electrode material (the source-drain electrode material in TFT), a conductive material solution, such as a metallic nano-particle solution and a conductive polymer solution, is selected. A metallic nano-particle material has the mode where a metallic core exists at the center thereof and an organic compound is combined to cover it. As a representative of the center metallic core, gold, silver, copper, platinum, nickel, and palladium, etc. are selected. As the core, it may be one of these metals or a plurality of these metals may be mixed. Representative examples of the combining site between the metallic core and the organic compound are nitrogen, sulfur, and oxygen atoms. Part of the organic compound is a linear hydrocarbon or a cyclic hydrocarbon, and it may have a substituent. These metallic nano-particles are dispersed to form a liquid material which becomes a printable ink. Moreover, the conductive polymer solution may be used as a material for coating or printing. Finally, such metallic fine particles are heated and metallized (becomes a metal). This metallization can be done by oxidation or exposure to a halogen gas.

As the aforementioned organic semiconductor material, a polyacene derivative, for example pentacene and rubrene, a polythiophene derivative, a polyethylene vinylene derivative, a polypyrrole derivative, a polyisothianaphthene derivative, a polyaniline derivative, a polyacetylene derivative, a polydiacetylene derivative, a polyazulene derivative, a polypyrene derivative, a polycarbazole derivative, a polyselenophene derivative, a polybenzofuran derivative, a polyphenylene derivative, a polyindole derivative, a polypyridazine derivative, a porphyrin derivative, a metallophthalocyanine derivative, a fullerene derivative, or a polymer or an oligomer where two or more of these repetitive units are mixed can be listed as the example. Moreover, a doping treatment may be applied to these organic semiconductor materials as necessary. Furthermore, in order to improve the performance of the organic semiconductor transistor, a surface treatment may be applied to the bonding surface between the organic semiconductor and the substrate in the step before printing the organic semiconductor. Moreover, these organic semiconductors may be stacked as necessary.

Moreover, ZnO and InGaZnO (indium gallium zinc oxide), etc. can be given as an example of the oxide semiconductor material.

Next, some embodiments of the present invention will be explained specifically. Since both positional precision and the minimum value of the drawing stroke width were 20 μm in the inkjet printer used in this embodiment, the stroke width of the gate electrode was controlled to be 20 μm or more.

First Embodiment

This embodiment is an example of a thin film transistor which uses an organic semiconductor. FIGS. 2A and 2B to FIGS. 9A and 9B are cross-sectional views and top views illustrating a thin film transistor device where this example is shown in accordance with the order of the manufacturing process. This embodiment is an example where the first electrode (it corresponds to the gate electrode in this embodiment) is aligned with respect to the second and third electrodes (it corresponds to the source-drain electrodes in this embodiment) by using one gate pattern mask. Each drawing having the figure number ending in "B" is a plane view and each drawing having the figure number ending in "A" is a cross-sectional view of the aforementioned plane view at the line A-A'. Hereinafter, in the plane view and the cross-sectional view of the device shown in accordance with the order of the manufacturing process in the present invention, from FIGS. 2A and 2B to FIGS. 9A and 9B and from FIGS. 17A and 17B to FIGS. 25A and 25B, where each drawing having the figure number ending in "A" is the cross-sectional view and each drawing having the figure number ending in "B" is the plane view. From FIGS. 10A and 10B to FIGS. 16A and 16B, each drawing having the figure number ending in "A" is the plane view and each drawing having the figure number ending in "B" is the cross-sectional view.

Figure 2A:
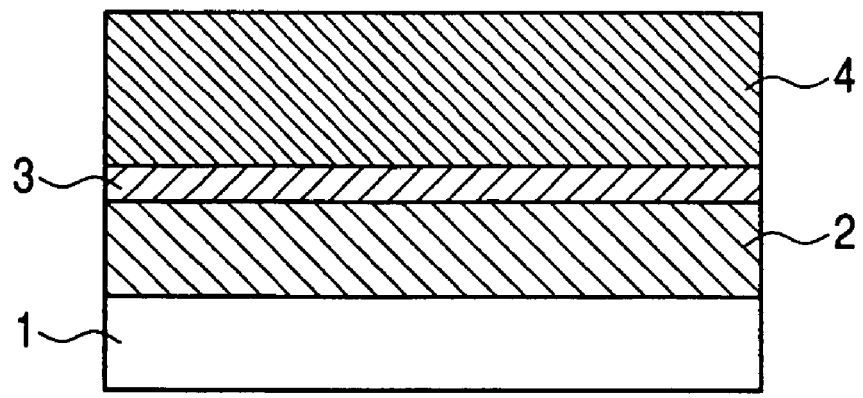
FIG. 2A is a cross-sectional view at the line A-A' in the plane view of FIG. 2B illustrating in order of a manufacturing process of the transistor of the first embodiment of the present invention.
Figure 2B:
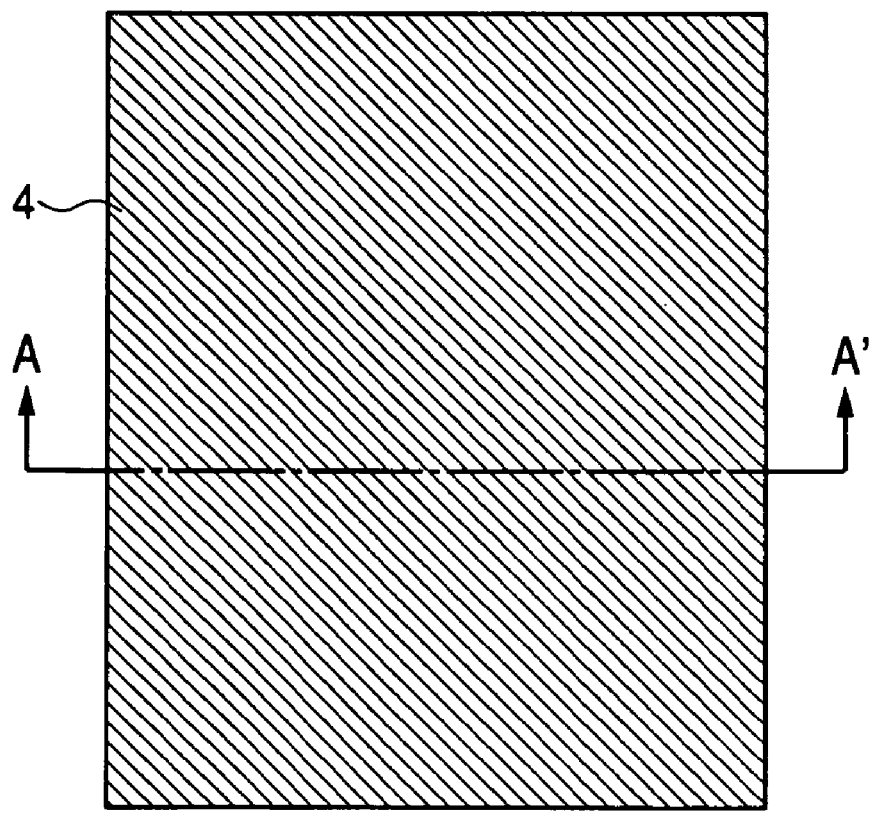
FIG. 2B is a plane view illustrating in order of a manufacturing process of the transistor of the first embodiment of the present invention.

(1) A first conductor (a material film of the gate electrode) and an insulator (after processing, it will be the gate insulator) are stacked and a photoresist film is formed thereon. That is, using a polycarbonate which is an organic compound as a substrate, a 100 nm thick aluminum 2 to be the first electrode is deposited over the substrate 1 by a sputtering method. After that, 30 nm of the surface of the aluminum is oxidized by anodic oxidation to form the aluminum film 3 which is the first insulator. This aluminum film 3 becomes the first insulator, that is, the gate insulator in the TFT. After that, an i-line resist 4 was coated to be 1 μm and it was fired at 100° C. for two minutes (the cross-sectional view: FIG. 2A and the plane view: FIG. 2B).

The first insulator 3 may be formed by a deposition method, etc. The same applies to each of the following embodiments.

Figure 3A:
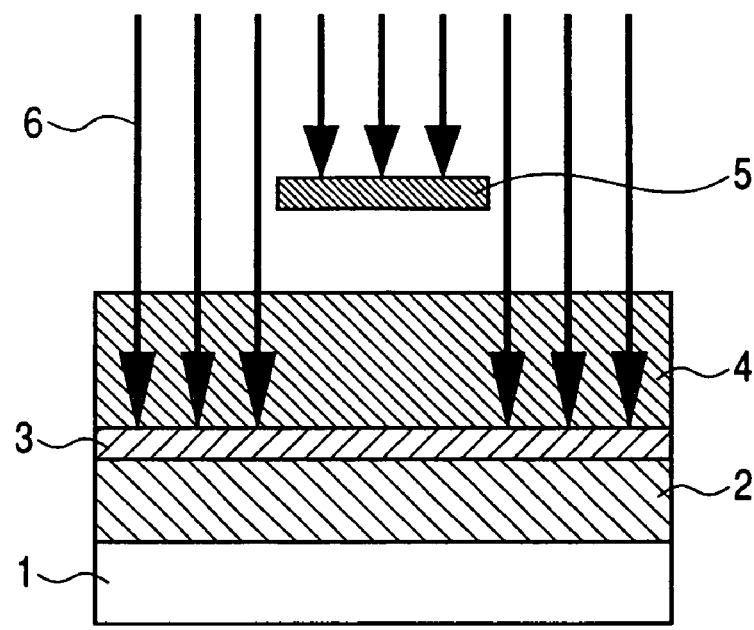
FIG. 3A is a cross-sectional view at the line A-A' in the plane view of FIG. 3B illustrating in order of a manufacturing process of the transistor of the first embodiment of the present invention.
Figure 3B:
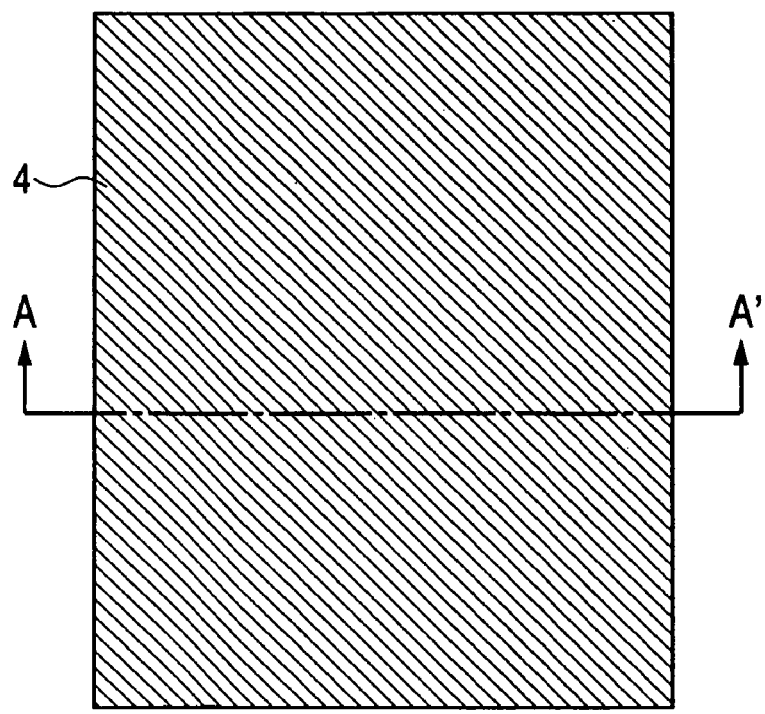
FIG. 3B is a plane view illustrating in order of a manufacturing process of the transistor of the first embodiment of the present invention.
Figure 4A:
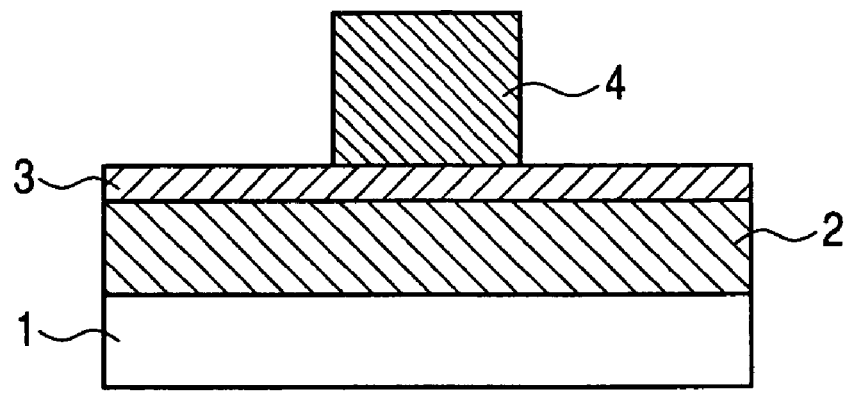
FIG. 4A is a cross-sectional view at the line A-A' in the plane view of FIG. 4B illustrating in order of a manufacturing process of the transistor of the first embodiment of the present invention.
Figure 4B:
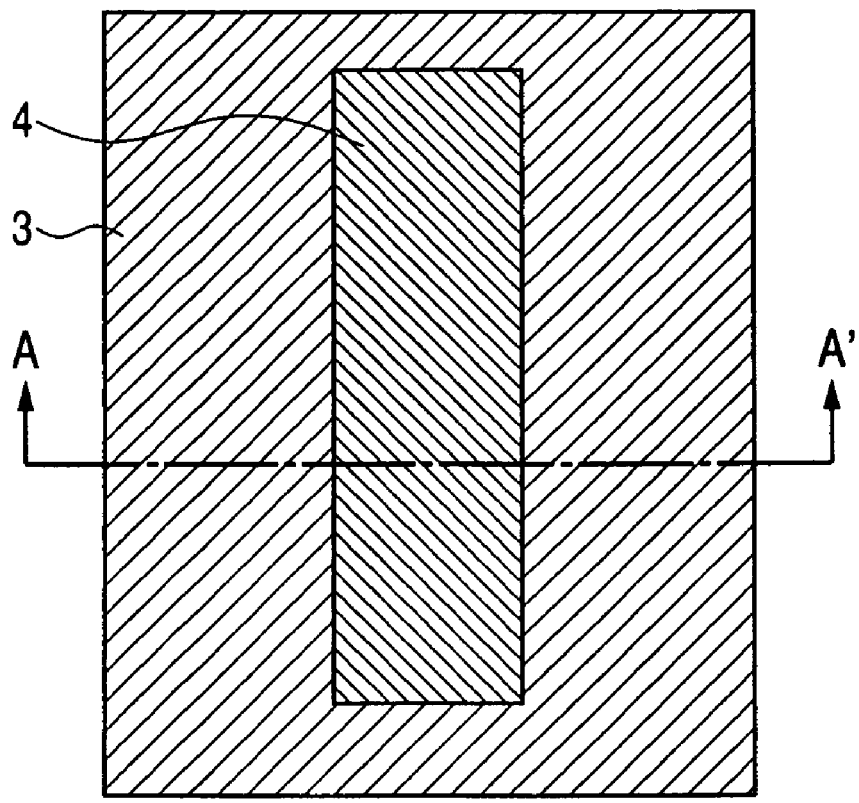
FIG. 4B is a plane view showing, in order, a manufacturing process of the transistor of the first embodiment of the present invention.

(2) The photoresist film is processed to be a desired shape (the shape of the gate electrode in the case of a TFT). That is, the photoresist 4 was exposed by the i-line 6 from a high-pressure mercury vapor lamp using the photomask 5 (used for the gate pattern in this example) (the cross-sectional view: FIG. 3A, the plane view: FIG. 3B). The substrate was heated for two minutes at 100° C. and developed by a 2.38 w % tetramethylammonium solution. Moreover, it was washed by water to obtain a resist pattern 4 processed in the first electrode pattern (a pattern for the gate electrode) (cross-sectional view: FIG. 4A, plane view: FIG. 4B).

Figure 5A:
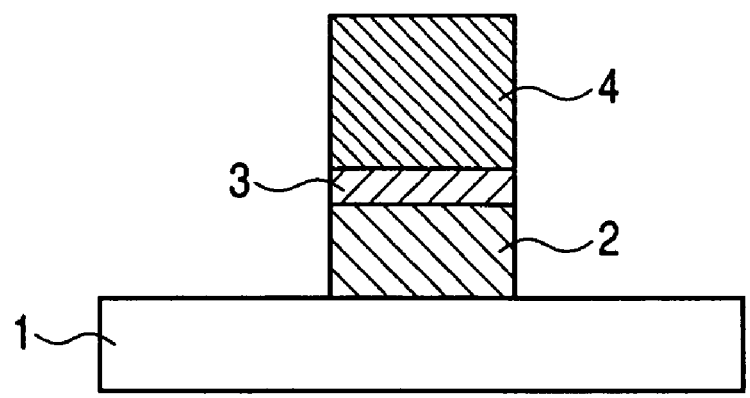
FIG. 5A is a cross-sectional view at the line A-A' in the plane view of FIG. 5B illustrating in order of a manufacturing process of the transistor of the first embodiment of the present invention.
Figure 5B:
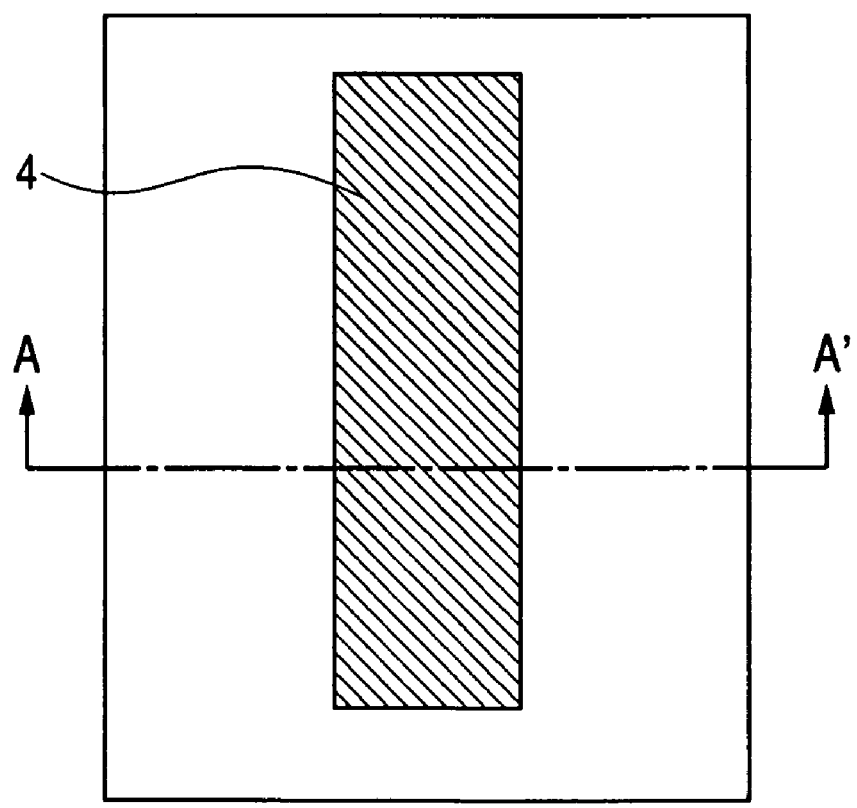
FIG. 5B is a plane view illustrating in order of a manufacturing process of the transistor of the first embodiment of the present invention.

(3) By using the processed photoresist pattern, the stacked film of the first conductor and the first insulator is processed to be the stacked film of the first electrode 2 (it corresponds to the gate electrode in the case of a TFT) and the first insulator 3 (it corresponds to the gate insulator in the case of a TFT). That is, the alumina layer 3 and the aluminum layer 2 were wet-etched by the 2.38 w % tetramethylammonium solution to obtain the gate pattern shape (the cross-sectional view: FIG. 5A, the plane view: FIG. 5B).

Figure 6A:
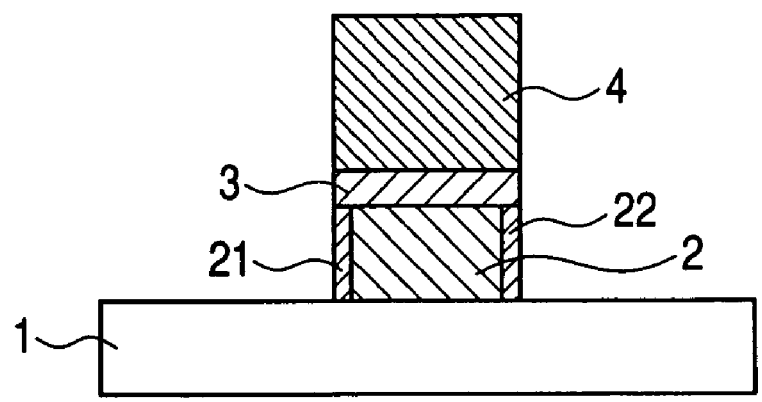
FIG. 6A is a cross-sectional view at the line A-A' in the plane view of FIG. 6B illustrating in order of a manufacturing process of the transistor of the first embodiment of the present invention.
Figure 6B:
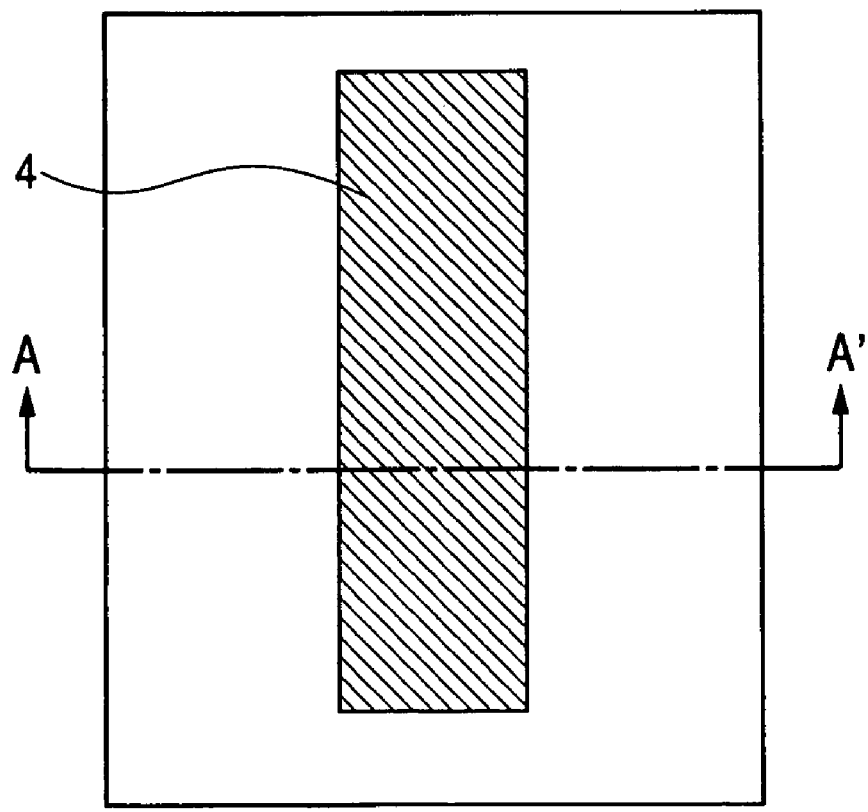
FIG. 6B is a plane view illustrating in order of a manufacturing process of the transistor of the first embodiment of the present invention.
Figure 7A:
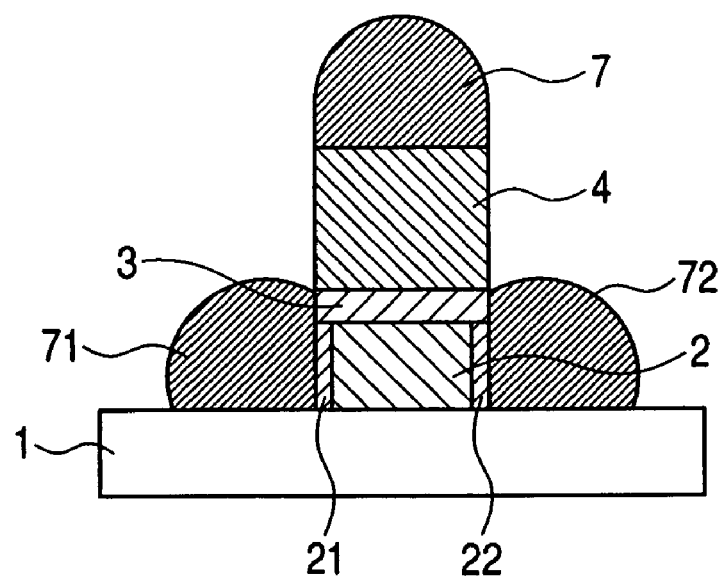
FIG. 7A is a cross-sectional view at the line A-A' in the plane view of FIG. 7B illustrating in order of a manufacturing process of the transistor of the first embodiment of the present invention.
Figure 7B:
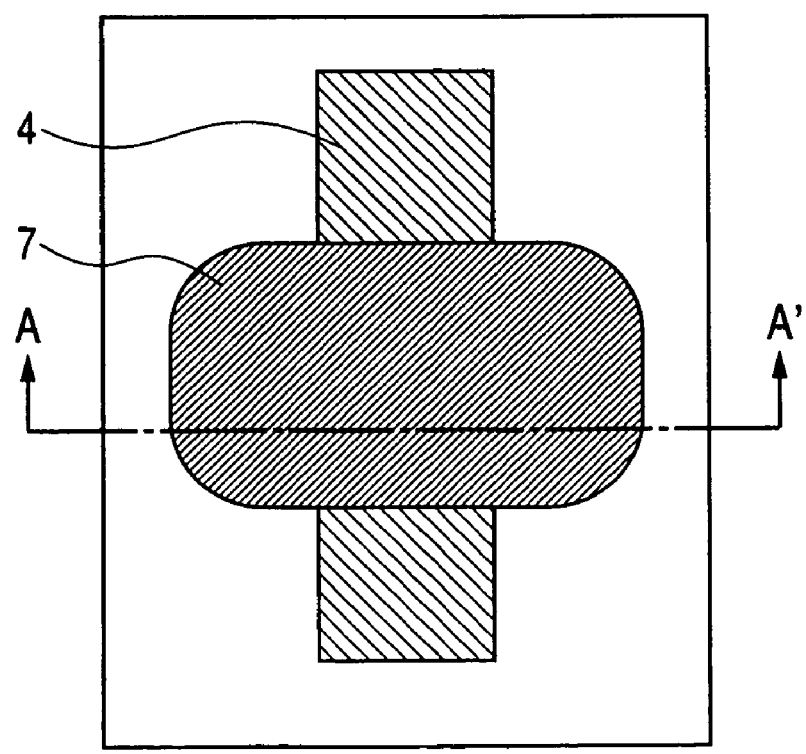
FIG. 7B is a plane view illustrating in order of a manufacturing process of the transistor of the first embodiment of the present invention.

(4) The second insulators 21 and 22 are formed over a pair of sidewalls opposite the first electrode 2. That is, the sidewalls of the patterned first electrode (aluminum layer in this example) 2 were anodized. The gate pattern of the first electrode 2 aluminum in this example), surrounded by the second insulators 21 and 22 (the anodized film in this example) formed like this and the substrate 1, was obtained (the cross-sectional view: FIG. 6A, the plane view: FIG. 6B).

(5) The pattern is formed by coating (that is, coating including printing) the material for the second and third electrodes (7, 71, and 72) over the second and third electrode regions and the first electrode pattern region. That is, the metal nano fine particle solution was printed onto the necessary part by using an inkjet method and heated at 120° C. for 20 minutes. The metal nano-particles used in this example were gold nano-particles where the surface thereof was protected by butane-thiolate and which was dispersed in toluene solution. The grain diameter of the metallic cores of the metal nano-particles was 4 nm on average.

Figure 8A:
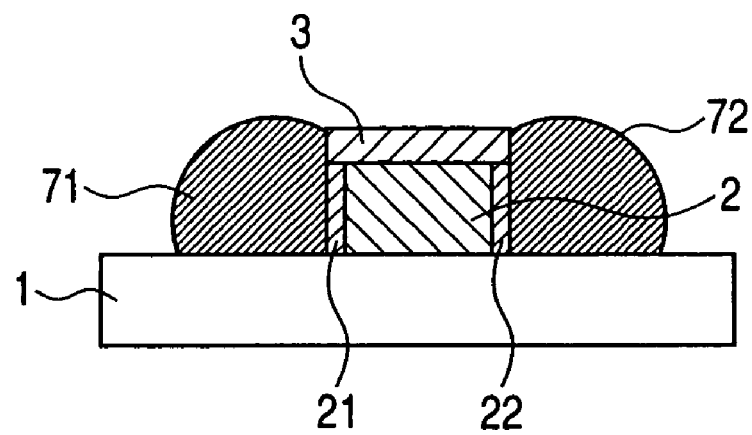
FIG. 8A is a cross-sectional view at the line A-A' in the plane view of FIG. 8B illustrating in order of a manufacturing process of the transistor of the first embodiment of the present invention.
Figure 8B:
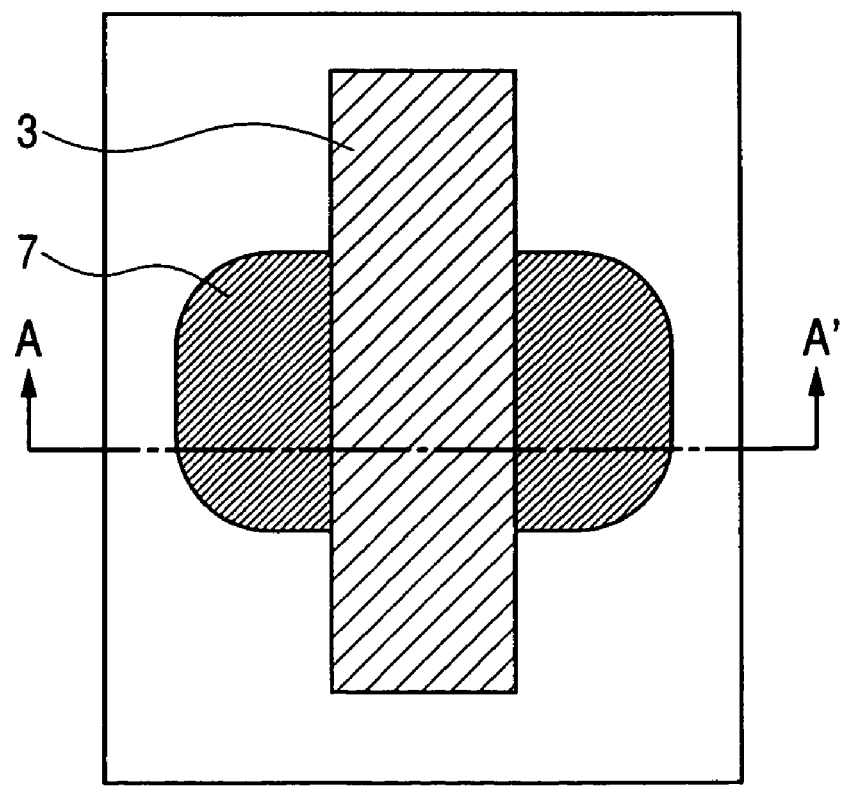
FIG. 8B is a plane view illustrating in order of a manufacturing process of the transistor of the first embodiment of the present invention.

(6) The photoresist 4 at the upper part of the first electrode 2 is removed and the material for the second and third electrodes 7 over the first electrode is removed by lift-off. As a result, the second and third electrodes 71 and 72 were formed. That is, the resist 4 was peeled off by using tetrahydrofuran, and the metal 7 on the first electrode 2 (the gate electrode in this example) was peeled off. At this time, the heights of the second and third electrodes (the source and drain electrodes in this example) 71 and 72 were 100 nm. As shown in FIG. 8A, the second insulators 21 and 22 are provided to insulate between the first electrode 2 and a pair of the second and third electrodes 71 and 72.

Figure 9A:
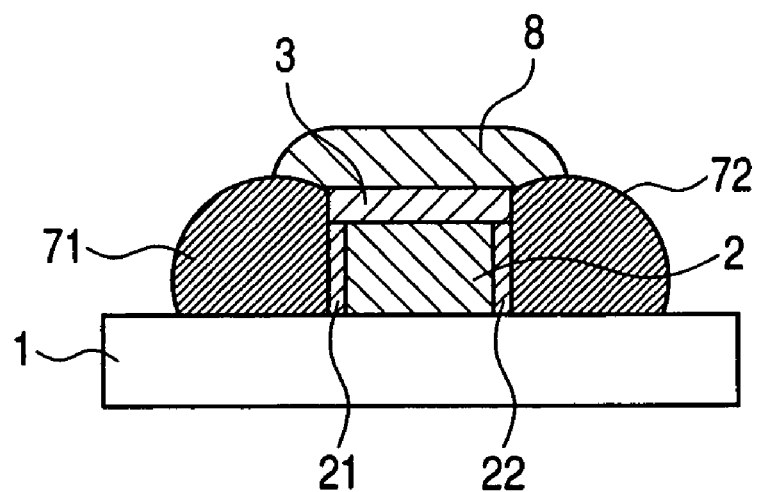
FIG. 9A is a cross-sectional view at the line A-A' in the plane view of FIG. 9B illustrating in order of a manufacturing process of the semiconductor device including the transistor of the first embodiment of the present invention.
Figure 9B:
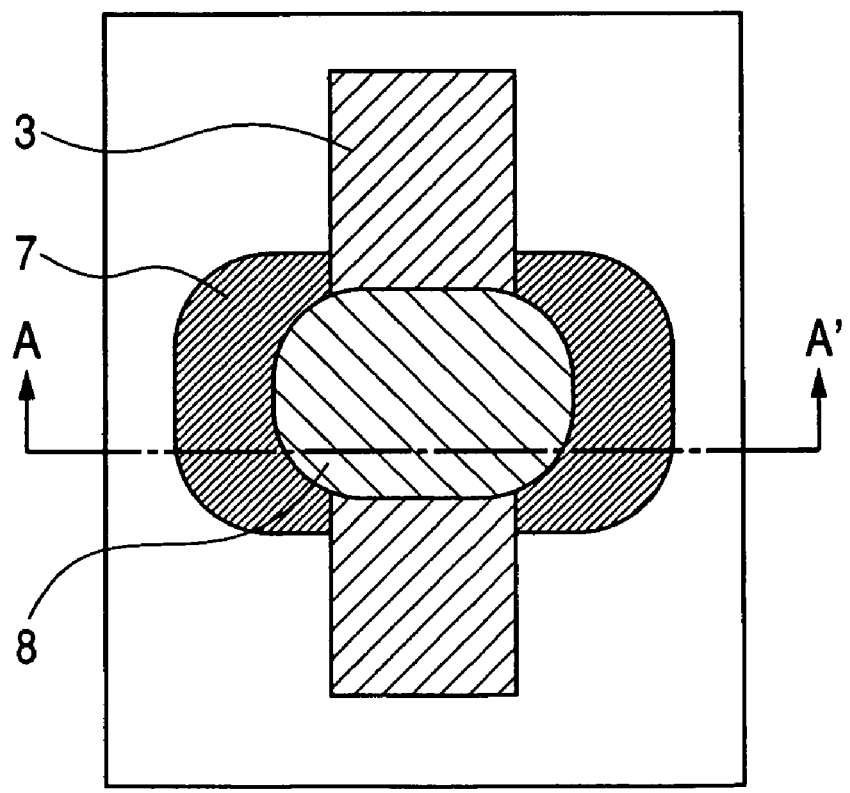
FIG. 9B is a plane view illustrating in order of a manufacturing process of the semiconductor device including the transistor of the first embodiment of the present invention.
Figure 10A:
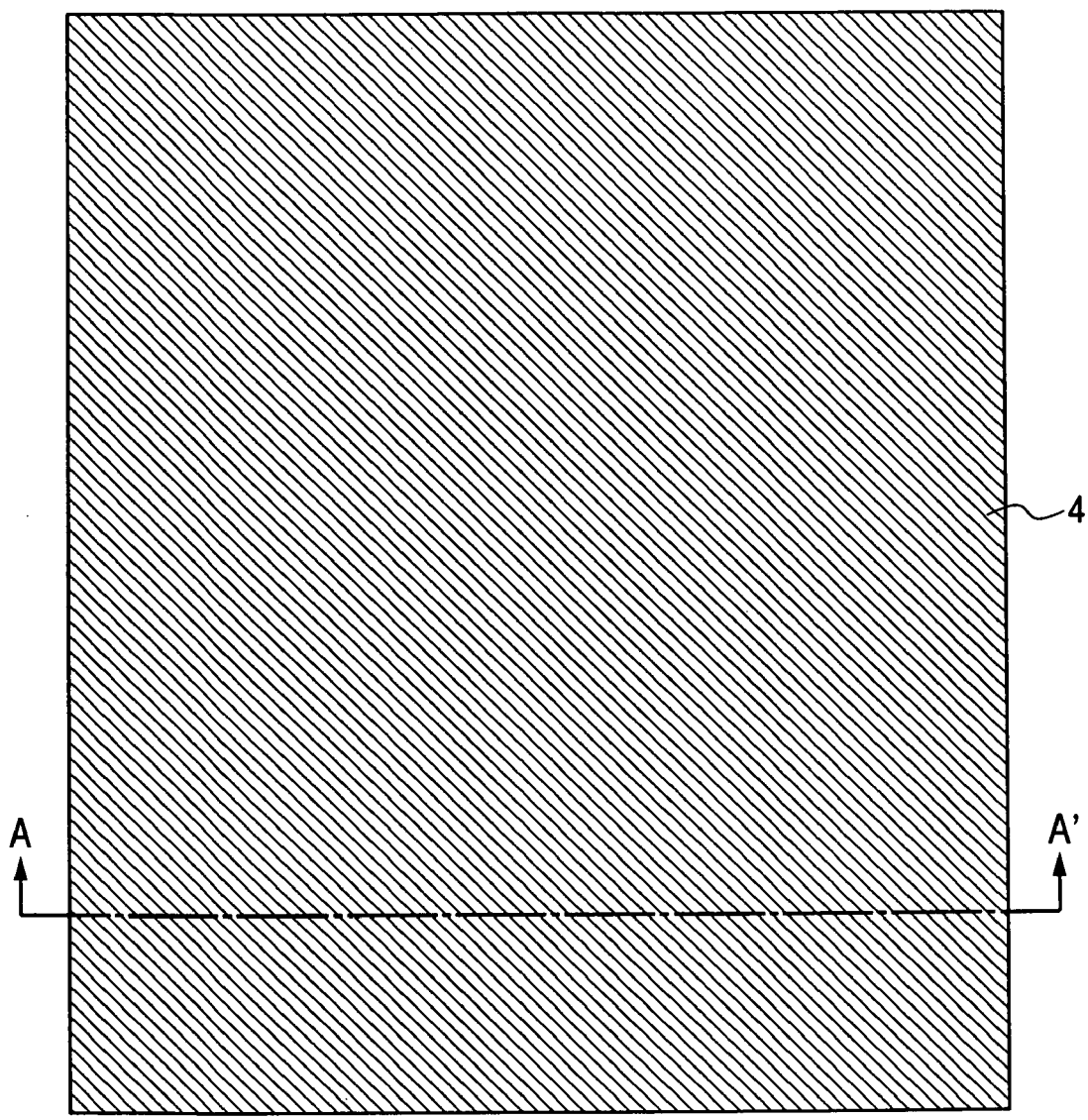
FIG. 10B is a plane view illustrating in order of a manufacturing process of the semiconductor device including the transistor of the second embodiment of the present invention.
Figure 10B:
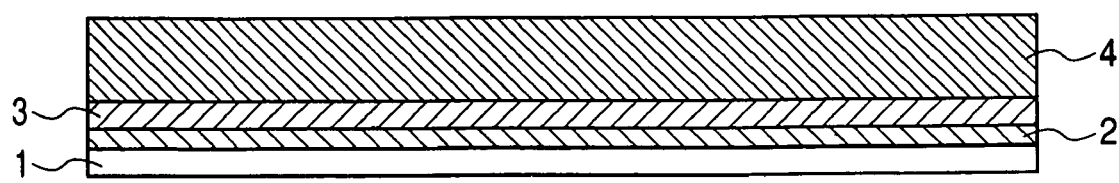

(7) The coatable or printable semiconductor material layer is coated (that is, coating including printing) between the second and third electrodes 71 and 72 (between the source-drain electrodes in this example) to contact both electrodes 71 and 72 with the semiconductor material layer 8. That is, between a pair of the second and third electrodes 71 and 72 on the first electrode 2, the semiconductor layer 8 to be the channel part was printed by an inkjet method using a 5% chloroform solution of an organic semiconductor (Poly (3-hexylthiophene-2, 5-diyl) Regioregular), and heat-treated at 120° C. for five minutes (the cross-sectional view: FIG. 9A, the plane view: FIG. 9B). The thickness of the semiconductor layer 8 to be the channel part was 5 μm.

When the mobility of this transistor was examined, it turned out to be 0.085 cm$^2$/Vs. This value is characteristic of an organic thin film transistor in which both top and bottom electrodes are considered to have no misalignment relative to each other. Moreover, the substrate was neither warped nor distorted, it was much the same as that before the pattern was formed.

Hereinafter, an example will be described, in which each material of the aforementioned embodiment is changed.

[About the Gate Electrode Material]

When the aluminum in the first embodiment is changed to tantalum and a transistor was manufactured in the same manner, the mobility becomes 0.08 cm$^2$/Vs, resulting in a transistor being obtained which can stand comparison with any other.

[About the Substrate]

Except for changing the substrate from a silicon compound in the first embodiment to a glass substrate, everything was carried out in the in the same manner as the first embodiment to form an organic thin film transistor. The mobility of this transistor was 0.105 cm$^2$/Vs which was the same as a plastic substrate.

Except for changing the substrate in the first embodiment to a paper with a polyimide coated surface, everything was carried out in the same manner as the first embodiment to form an organic thin film transistor. The mobility of this transistor was 0.095 cm$^2$/Vs which was the same as a plastic substrate.

A similar effect can be obtained when the aforementioned, for instance, plastic film as the substrate is polyethylene terephthalate, polyethylene naphthalate, polyetherimide, polyethersulfone, polyether ether ketone, polyphenylene sulfide, polyacrylate, polyimide, polycarbonate, cellulose triacetate, cellulose acetate propionate, etc.

[About the Conductive Material]

Except for changing the gold nano-particles to silver nano-particles, everything was carried out in the same manner as the first embodiment to form an organic thin film transistor. The mobility of this transistor was 0.077 cm$^2$/Vs. When platinum nano-particles were used, the mobility was 0.1 cm$^2$/Vs and, in the case of copper nano-particles, the mobility was 0.08 cm$^2$/Vs which was the same performance as the one using gold nano-particles. In each of the aforementioned materials, for instance, there is a difference in the properties due to the difference of the work functions between gold and silver. However, the objectives of the present invention can be sufficiently achieved. In these materials, the gold nano-particles are the most advantageous materials from a variety of viewpoints such as the performance, the ease of synthesis, and the preservation of stability. Moreover, when a solution of PEDOT/PSS which is a conductive polymer is used, the mobility thereof becomes 0.115 cm$^2$/Vs, which means that a similar performance could be obtained.

If gold, silver, copper, platinum, nickel, or palladium, etc. is used as the center metallic core of the metal nano-particle, the objectives of the present invention can be sufficiently achieved. As the core thereof, one or a plurality of these metals may be mixed.

[About the Semiconductor Material]

Except for changing the chloroform solution of the (Poly (3-hexylthiophene-2, 5-diyl) Regioregular) in the first embodiment into, for instance, an emeraldine salt doped polyaniline solution, everything was carried out in the same manner as the first embodiment, resulting in a transistor being formed. The mobility of this transistor was 0.05 cm$^2$/Vs. Such an example also could sufficiently achieve the objectives of the present invention.

Moreover, changing the organic semiconductor of the first embodiment to a 1.3 wt % solution of Poly (styrene-sulfonate)/poly (s, 3-dihydrothieno-[3,4-b]-1,4-dioxin), a transistor was formed. The mobility of this transistor was 0.078 cm$^2$/Vs. This example is slightly advantageous with regard to the cost.

When pentacene is used by using an evaporation method, the mobility was 0.15 cm$^2$/Vs. Although this case was not a printing method, the cost was not different because it was a substitution of one part.

Moreover, when sputtered ZnO was used as the semiconductor material and not an organic material, the mobility became 4.0 cm$^2$/Vs. Moreover, when InGaZnO (indium gallium zinc oxide) was used as a semiconductor material, an excellent TFT could be provided. Furthermore, a silicon-containing semiconductor can be used.

Additionally, an excellent TFT can be provided by using an example, such as the above-mentioned polyacene derivative, for example pentacene and rubrene, a polythiophene derivative, a polyethylene vinylene derivative, a polypyrrole derivative, a polyisothianaphthene derivative, a polyaniline derivative, a polyacetylene derivative, a polydiacetylene derivative, a polyazulene derivative, a polypyrene derivative, a polycarbazole derivative, a polyselenophene derivative, a polybenzofuran derivative, a polyphenylene derivative, a polyindole derivative, a polypyridazine derivative, a porphyrin derivative, a metallophthalocyanine derivative, a fullerene derivative, or a polymer or an oligomer, etc. where two or more of these repetitive units are mixed, as a semiconductor material.

[About the Insulator]

In FIGS. 2A and 2B of the first embodiment, when the insulator formed over the aluminum was formed of the 0.5% xylene solution of epoxidized polybutadiene, the mobility was 0.09 cm$^2$/Vs. This value is almost similar to the value of the first embodiment. This example is slightly advantageous with regard to cost.

Moreover, when the insulator is formed of the 2% methyl amyl ketone solution of polyhydroxystyrene, the mobility was 0.07 cm$^2$/Vs, resulting in the objectives of the present invention being achieved. The polyhydroxystyrene of this example is inexpensive and there is an advantage that methyl amyl ketone which is a safe solvent can be used. Moreover, the mobility of one using 3% methyl amyl ketone solution of polyimide was 0.07 cm$^2$/Vs, resulting in the objectives of the present invention being achieved.

Second Embodiment

This embodiment is an example where a transistor is formed in a 3×4 matrix according to a procedure similar to the first embodiment. It is shown in from FIGS. 10A and 10B to FIGS. 16A and 16B. Each drawing having the figure number ending in "A" is the plane view and each drawing having the figure number ending in "B"t is the cross-sectional view at the line A-A' in the aforementioned plane view.

Although this example is the mode formed by juxtaposing two or more transistors, the formation method of each transistor is the same as the first embodiment except that a plurality of transistors is formed in the same process and the necessary connections are made on them. Therefore, herein, the different points will be mainly explained. The materials of each of the parts used in this example are the same as the first embodiment.

(1) The first conductor (a material film of the gate electrode) 2 and an insulator (after processing, it will be the gate insulator) 3 are stacked and a photoresist film is formed thereon. Herein, the aforementioned insulator 3 is made by anodizing the first conductor 2. In this mode, FIGS. 10A and 10B correspond to FIGS. 2B and 2A of the first embodiment.

(2) The photoresist film is formed in the desired shape (the shape of the gate electrode).

(3) By using the processed photoresist pattern 4, the stacked film of the first conductor and the first insulator is processed to be the stacked film of the first electrode 2 (the gate electrode) and the first insulator 3 (the gate insulator).

Figure 11A:
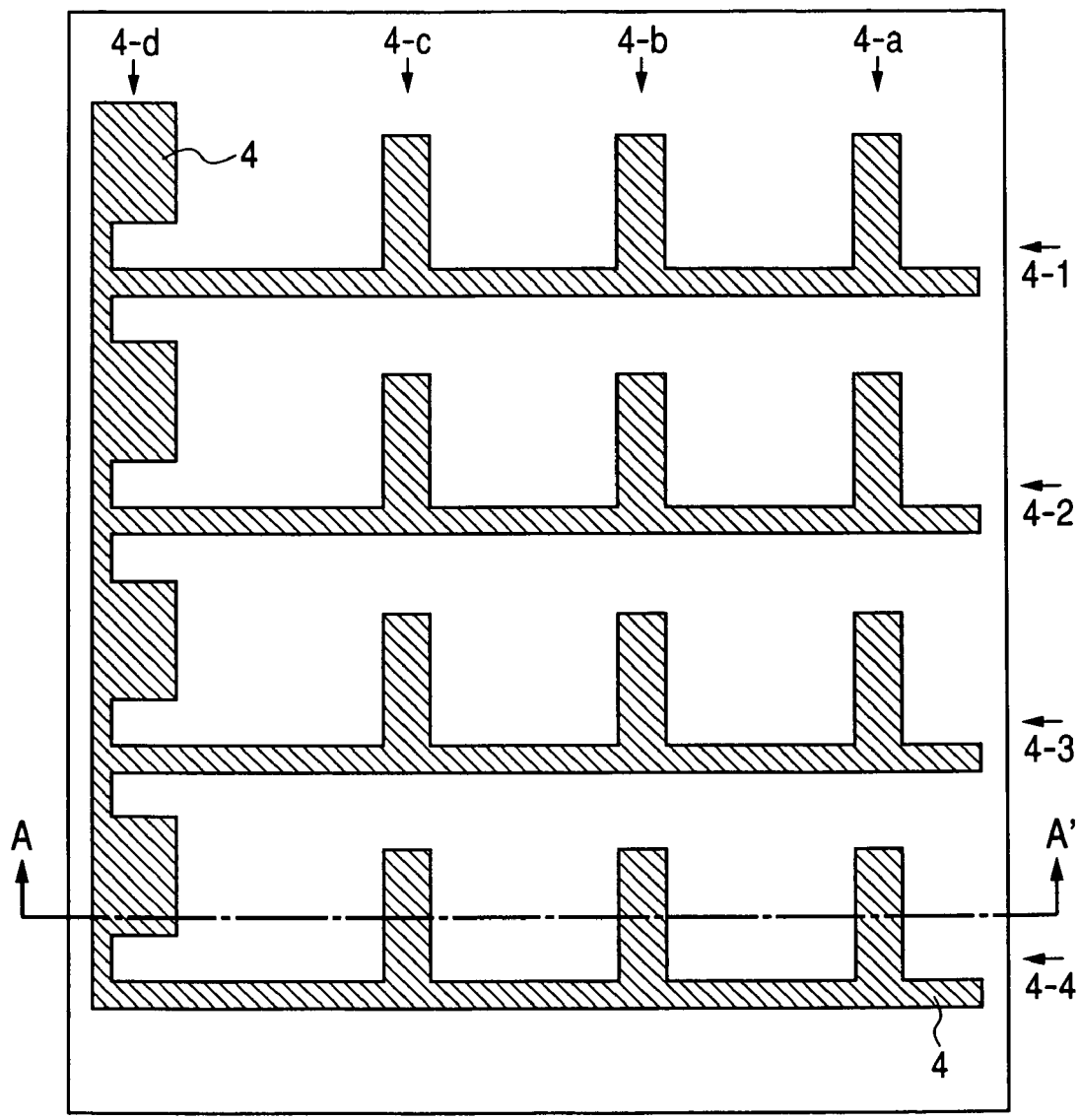
FIG. 11A is a plane view illustrating in order of a manufacturing process of the transistor of the second embodiment of the present invention.
Figure 11B:
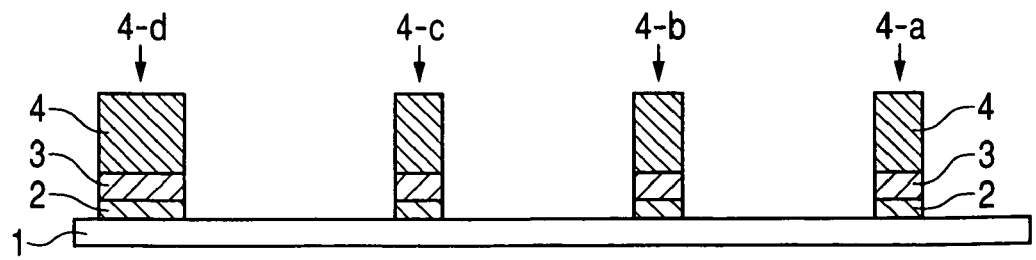
FIG. 11B is a cross-sectional view at the line A-A' in the plane view of FIG. 11A illustrating in order of a manufacturing process of the transistor of the second embodiment of the present invention.

In this example, as shown in FIG. 11A, the shape of the photoresist film 4 corresponding to the 3×4 matrix of the transistor is formed corresponding to the lines 4-$a$, 4-$b$, and 4-$c$ and the columns 4-1, 4-2, 4-3, and 4-4. In addition, the part which connects line-by-line is provided in the line 4-$d$, as necessary.

Figure 12A:
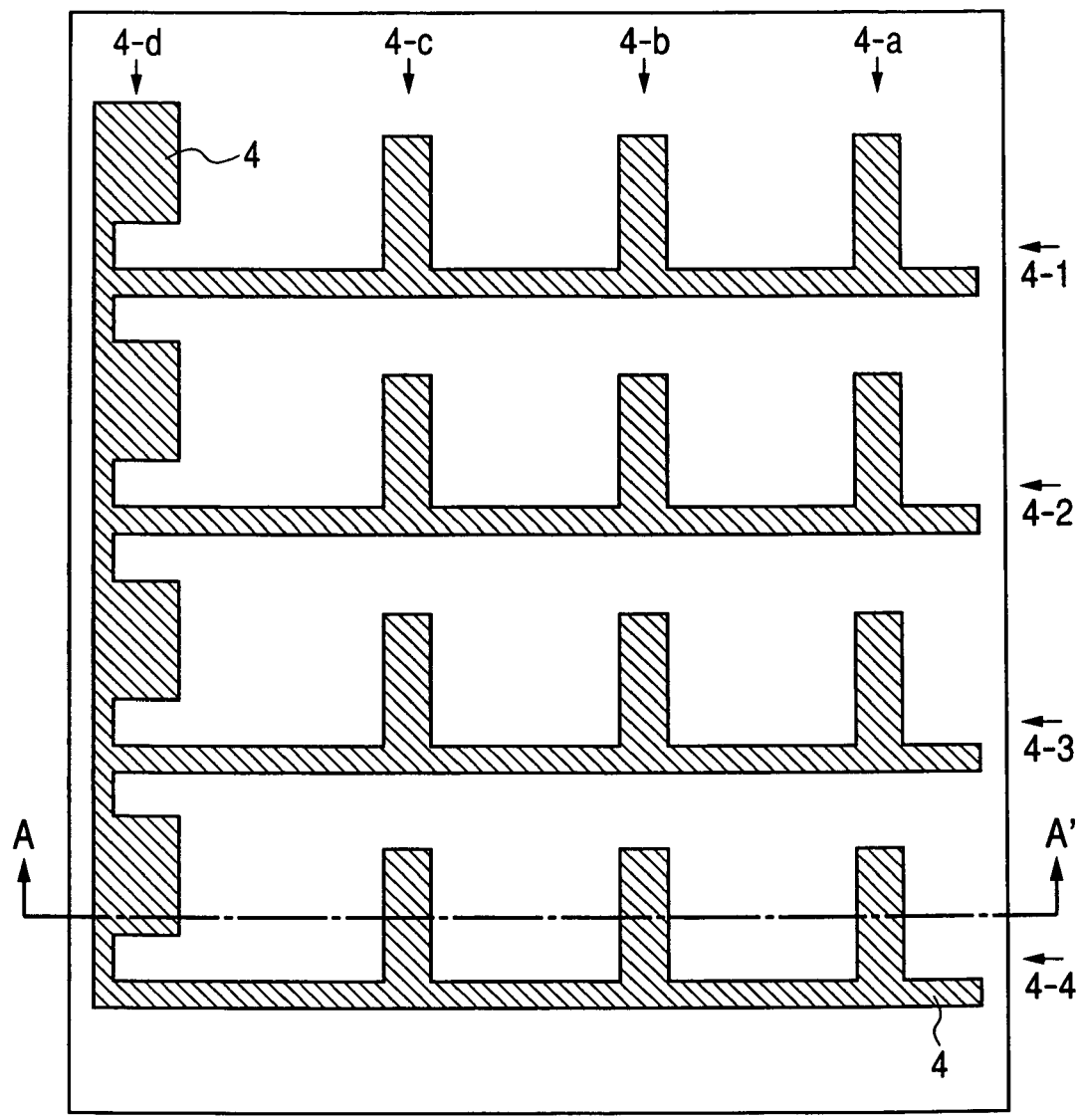
FIG. 12A is a plane view illustrating in order of a manufacturing process of the transistor of the second embodiment of the present invention.
Figure 12B:
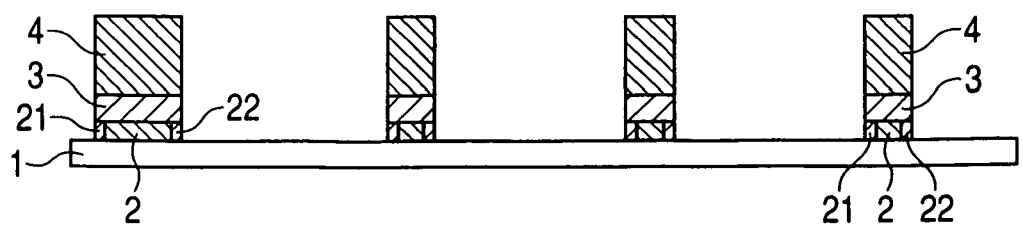
FIG. 12B is a cross-sectional view at the line A-A' in the plane view of FIG. 12A illustrating in order of a manufacturing process of the transistor of the second embodiment of the present invention.

(4) The second insulators 21 and 22 are formed over a pair of sidewalls opposite the first electrode 2 (FIGS. 12A and 12B). In this example, the second insulators 21 and 22 were formed by anodization of the first electrode 2.

Figure 13A:
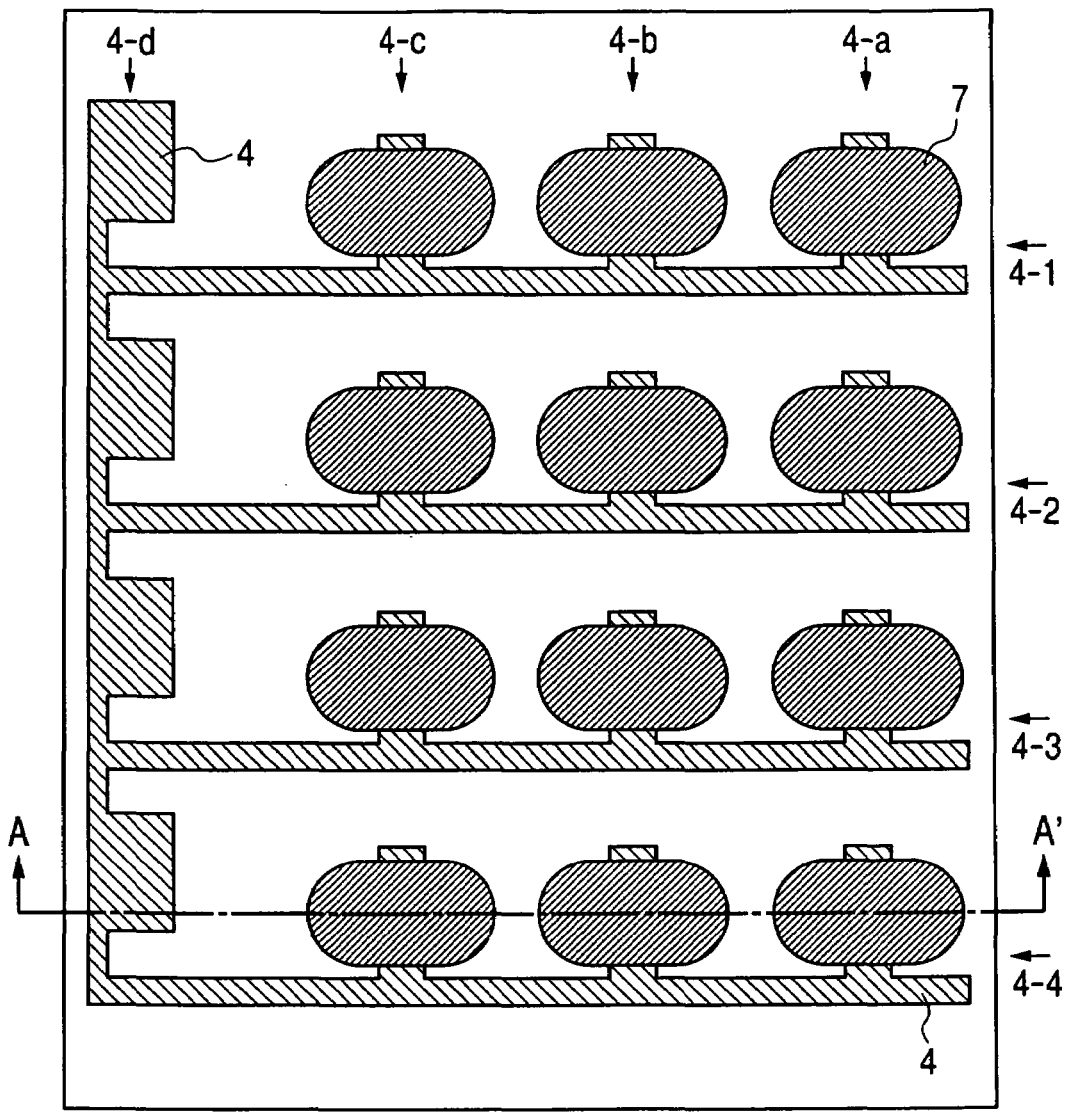
FIG. 13A is a plane view illustrating in order of a manufacturing process of the transistor of the second embodiment of the present invention.
Figure 13B:
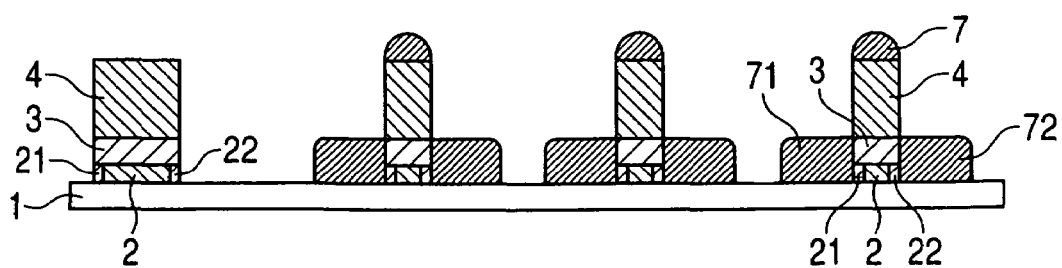
FIG. 13B is a cross-sectional view at the line A-A' in the plane view of FIG. 13A illustrating in order of a manufacturing process of the transistor of the second embodiment of the present invention.

(5) The semiconductor material layers 7, 71 and 72 are formed by coating the material for the second and third electrodes over the second and third electrode region and the first electrode pattern region (FIGS. 13A and 13B). Since the part of the line 4-$d$ is not the place where the transistor is formed, the semiconductor material layer is not formed naturally.

Figure 14A:
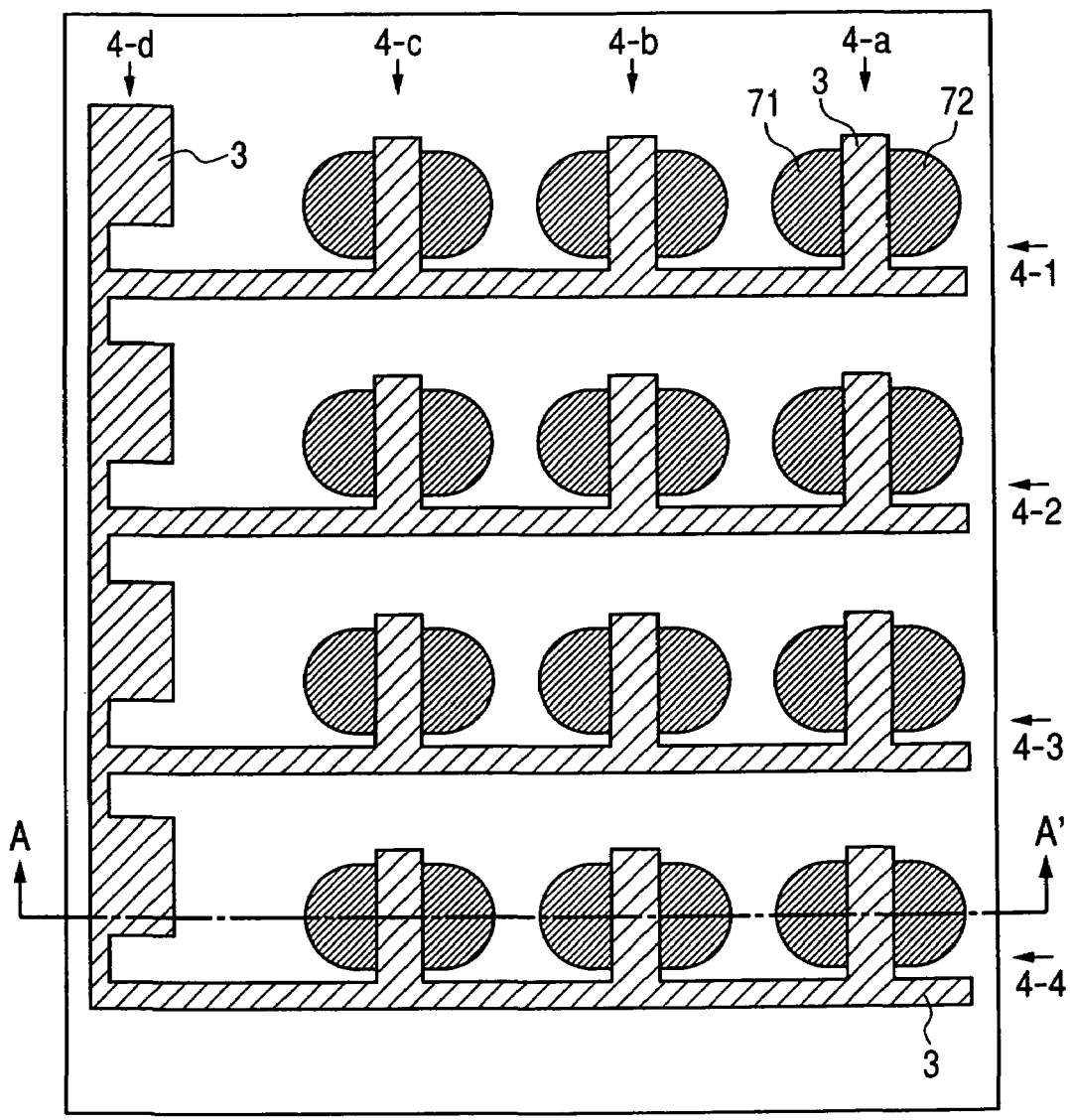
FIG. 14A is a plane view illustrating in order of a manufacturing process of the transistor of the second embodiment of the present invention.
Figure 14B:
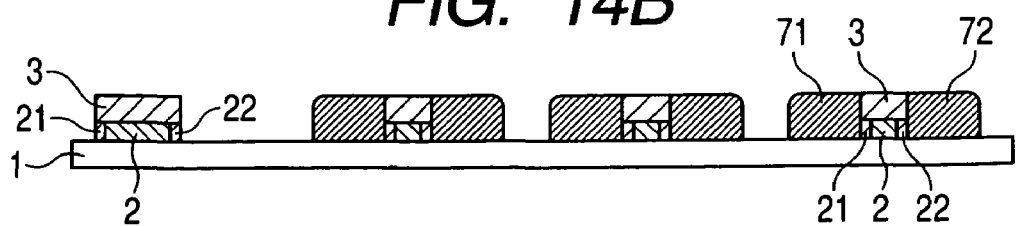
FIG. 14B is a cross-sectional view at the line A-A' in the plane view of FIG. 14A illustrating in order of a manufacturing process of the transistor of the second embodiment of the present invention.

(6) The photoresist 4 at the upper part of the first electrode 2 is removed and the material for the second and third electrodes 7 over the first electrode 2 is removed by lift-off. As a result, the second and third electrodes 71 and 72 are formed (FIGS. 14A and 14B).

(7) In this example, twelve transistors are wired to four gate wirings 110 and three third conductors (herein, the signal wiring) 111. The gate wiring 110 is not directly shown in the figure, however, it consists of the first conductor extending from the gate electrode 2 which exists below the gate insulator 3 of the top view.

Figure 15A:
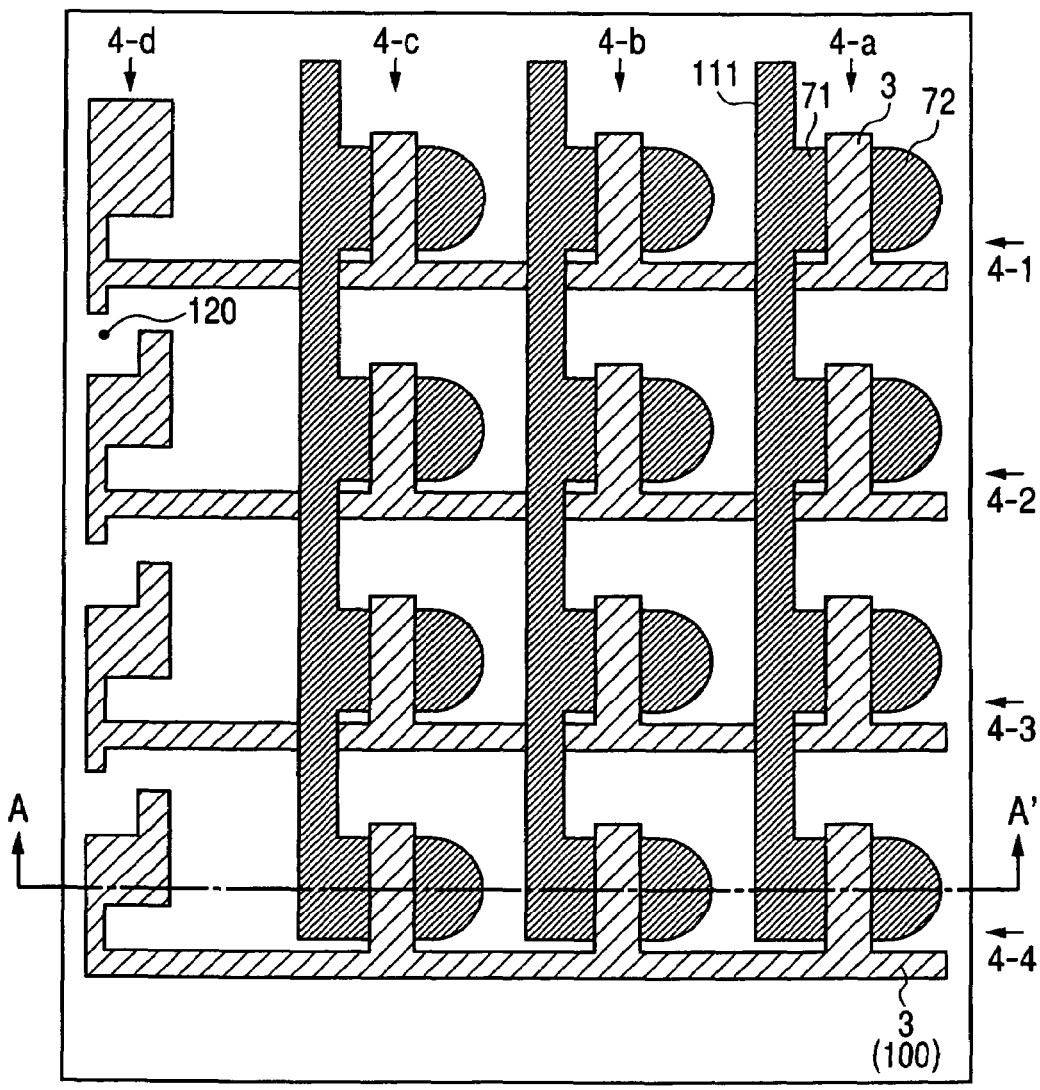
FIG. 15A is a plane view illustrating in order of a manufacturing process of the wiring substrate of the second embodiment of the present invention.
Figure 15B:
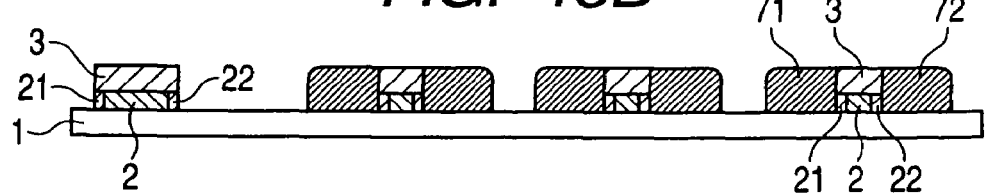
FIG. 15B is a cross-sectional view at the line A-A' in the plane view of FIG. 15A illustrating in order of a manufacturing process of the wiring substrate of the second embodiment of the present invention.

The point different from the first embodiment is that the part 120 which separates the gate wirings 110 shown in FIG. 15A is provided and that the wiring connections are made by using the third conductor (herein, signal wiring) 111. The procedure of separating the gate wirings is one where the aluminum 2 was directory peeled off by laser beam irradiation in this embodiment. The resist is coated over the entire surface, the resist only at the part which has to be peeled off may be peeled off by laser beam irradiation, and wet-etching may be performed by using an alkaline solution. The procedure of forming the signal wiring was the same as the procedure of forming the source-drain electrodes by using the gold nano-particles which are the same as those used for the formation of the source-drain electrodes. The cross-sectional structure of each transistor part is as shown in FIG. 15B and it is basically the same as that of the first embodiment.

Figure 16A:
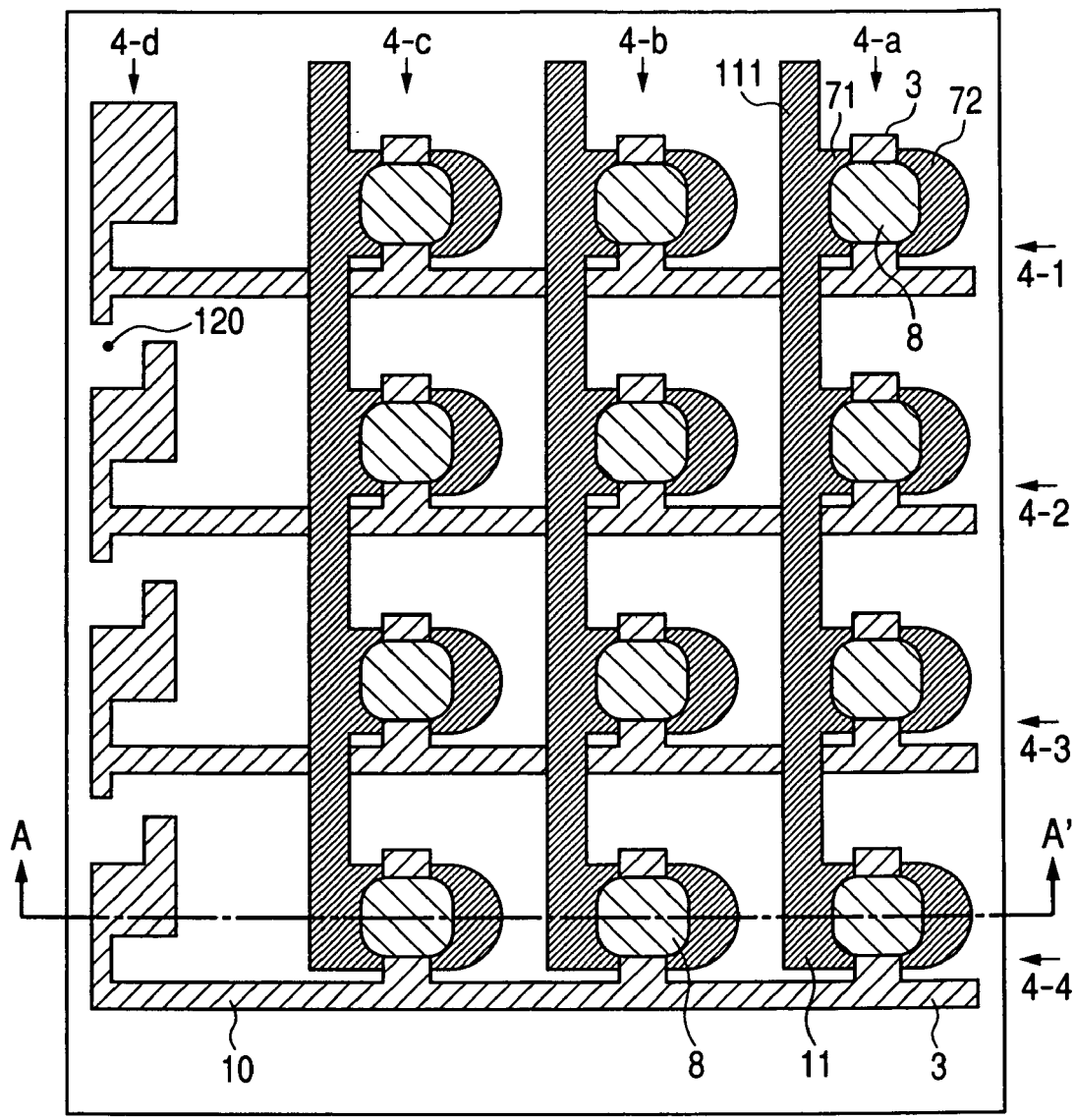
FIG. 16A is a plane view illustrating in order of a manufacturing process of the wiring substrate of the second embodiment of the present invention.
Figure 16B:
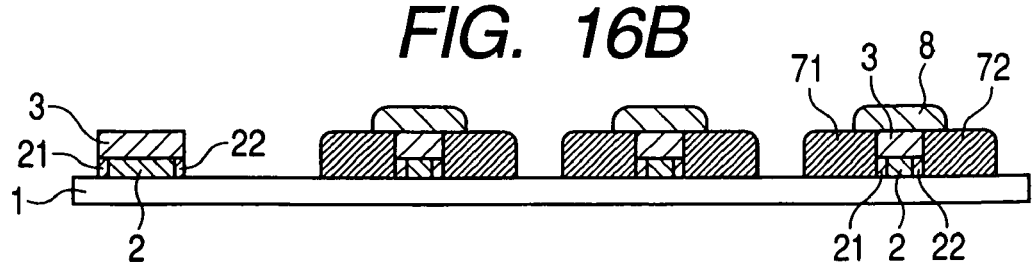
FIG. 16B is a cross-sectional view at the line A-A' in the plane view of FIG. 16A illustrating in order of a manufacturing process of the wiring substrate of the second embodiment of the present invention.

(8) The coatable and printable semiconductor material layer 8 is coated between the second and third electrodes 71 and 72 (between the source and drain electrodes) (FIGS. 16A and 16B).

When the performance of these transistors is measured individually, the mobility has a variation of about 5%.

Even in the second embodiment, if various materials are changed in each part as described in the first embodiment, the objectives of the present invention are sufficiently achieved.

Third Embodiment

This is an example in which two organic semiconductor transistors Tr1 and Tr2 are formed in the same manner as the first embodiment, and the gate electrode of one transistor is connected to the source electrode of another one. The manufacturing method is described from FIGS. 17A and 17B to FIGS. 25A and 25B. Each drawing having the figure number ending in "B" is the plane view and each drawing having the figure number ending in "A" is the cross-sectional view at the line A-A' in the aforementioned plane view. Not only in this example but also in the present invention, it is needless to say that various concrete modes, such as connections between transistors, can be taken depending on the circuit structure.

Figure 17A:
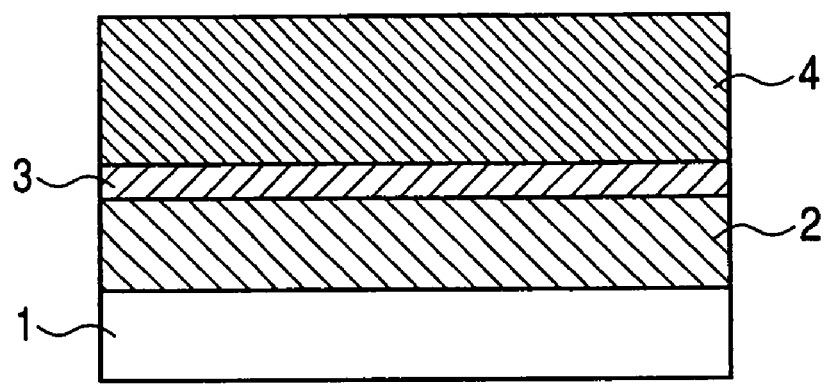
FIG. 17A is a cross-sectional view at the line A-A' in the plane view of FIG. 17B illustrating in order of a manufacturing process of the wiring substrate of the third embodiment of the present invention.
Figure 17B:
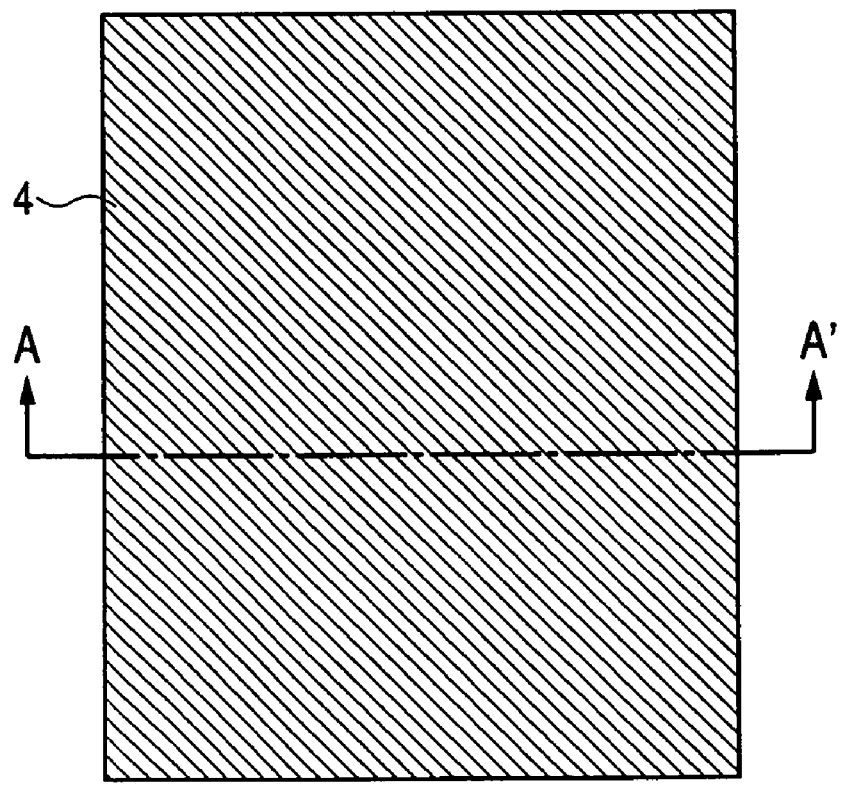
FIG. 17B is a plane view illustrating in order of a manufacturing process of the wiring substrate of the third embodiment of the present invention.

(1) The first conductor (the material film of the gate electrode) 2 and the insulator (after processing, it will be the gate insulator) 3 are stacked over the substrate 1, and the photoresist film is formed thereon (the cross-sectional view: FIG. 17A, the plane view: FIG. 17B). The manufacturing method itself is the same as the first embodiment.

(2) The photoresist film is formed in the desired shape (the shape of the gate electrode).

Figure 18A:
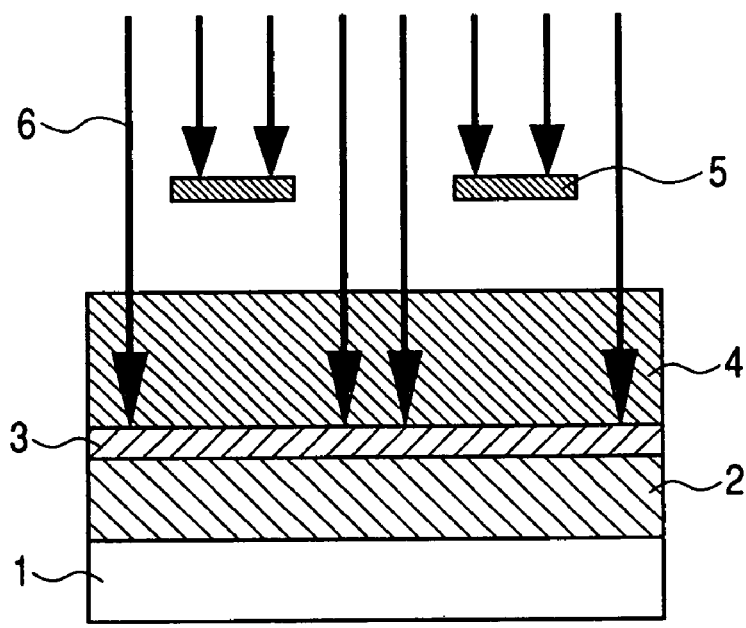
FIG. 18A is a cross-sectional view at the line A-A' in the plane view of FIG. 18B illustrating in order of a manufacturing process of the wiring substrate of the third embodiment of the present invention.
Figure 18B:
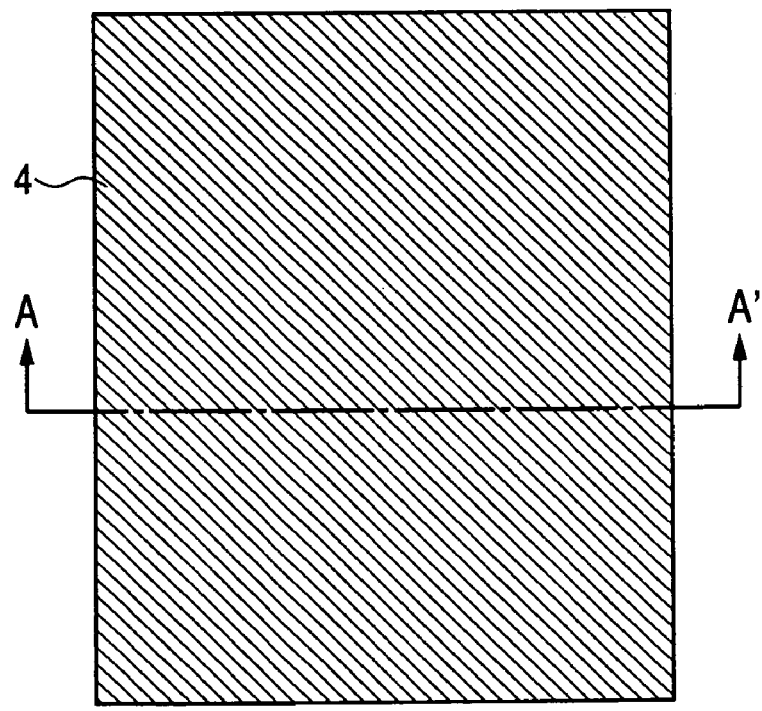
FIG. 18B is a plane view illustrating in order of a manufacturing process of the wiring substrate of the third embodiment of the present invention.
Figure 19A:
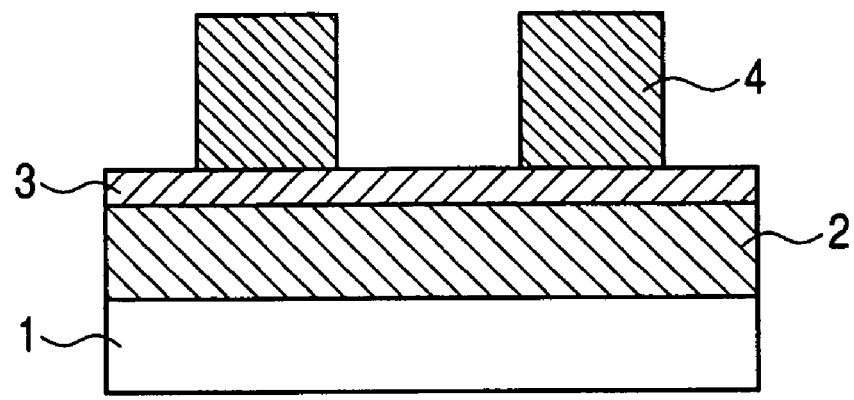
FIG. 19A is a cross-sectional view at the line A-A' in the plane view of FIG. 19B illustrating in order of a manufacturing process of the wiring substrate of the third embodiment of the present invention.
Figure 19B:
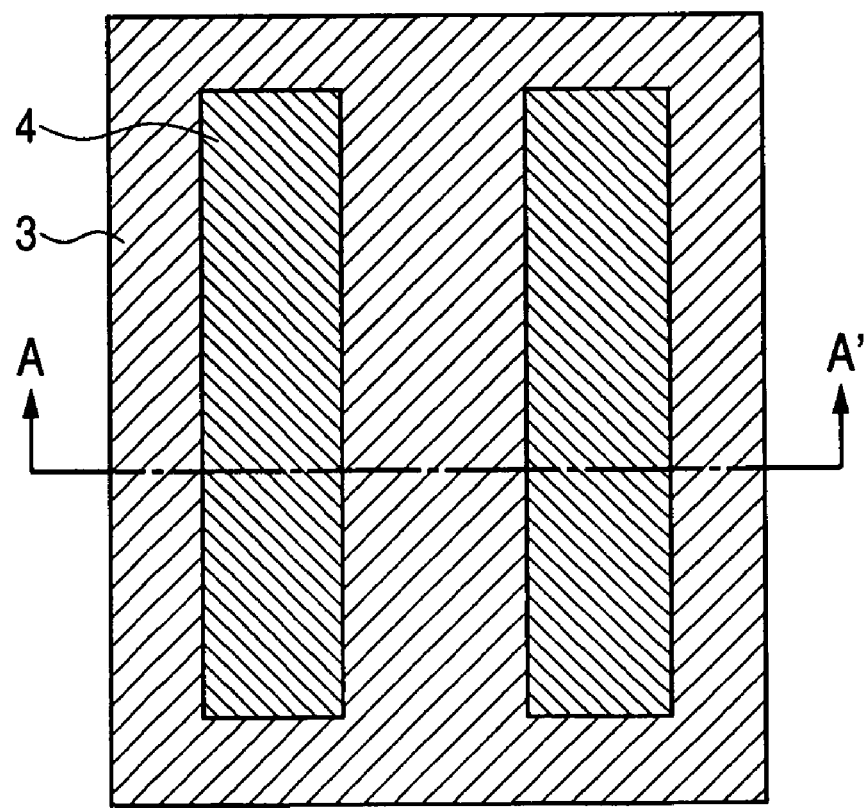
FIG. 19B is a plane view illustrating in order of a manufacturing process of the wiring substrate of the third embodiment of the present invention.

That is, the photoresist 4 was exposed by i-line 6 from a high-pressure mercury vapor lamp using the photomask 5 (for the gate pattern in this example) (the cross-sectional view: FIG. 18A, the plane view: FIG. 18B). The substrate is heated to develop the photoresist. Moreover, it was washed by water to obtain a resist pattern 4 processed in the first electrode pattern (a pattern for the gate electrode) (the cross-sectional view: FIG. 19A, the plane view: FIG. 19B).

Figure 20A:
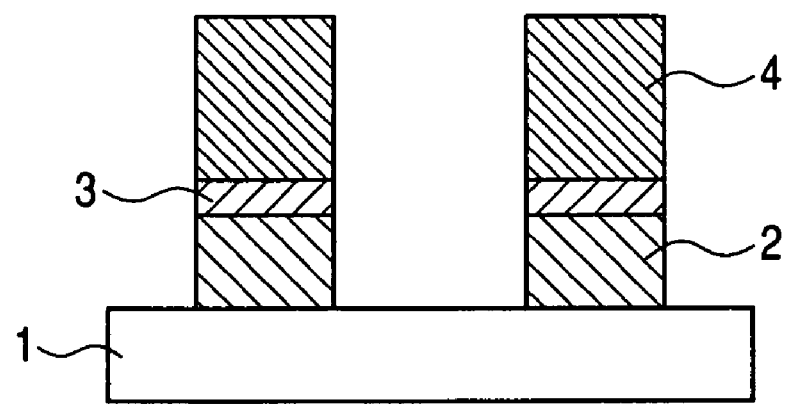
FIG. 20A is a cross-sectional view at the line A-A' in the plane view of FIG. 20B illustrating in order of a manufacturing process of the wiring substrate of the third embodiment of the present invention.
Figure 20B:
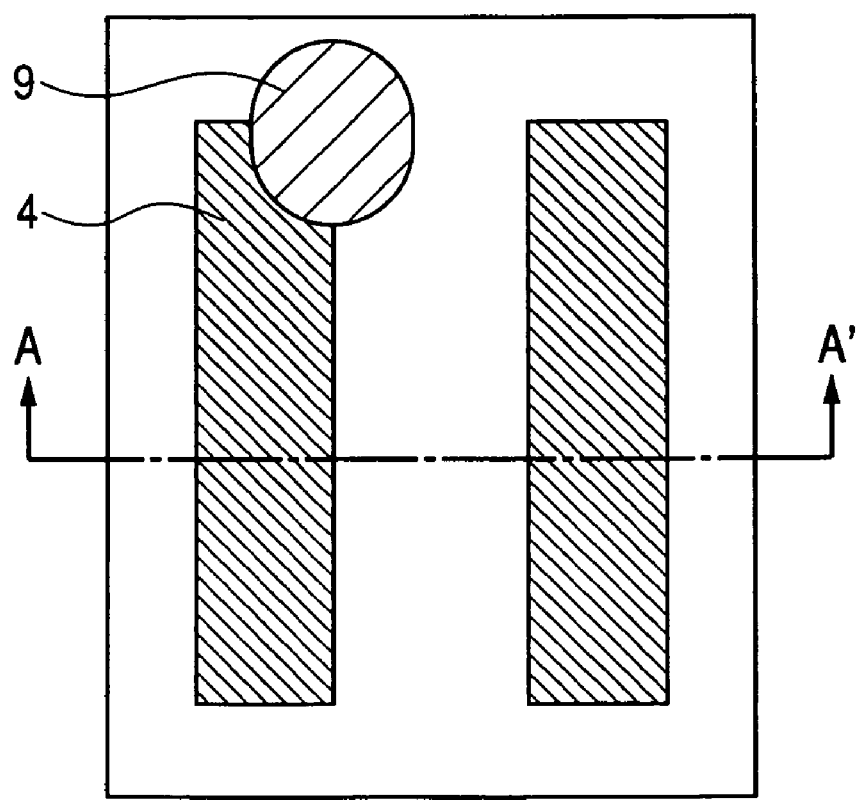
FIG. 20B is a plane view illustrating in order of a manufacturing process of the wiring substrate of the third embodiment of the present invention.

(3) By using the processed photoresist pattern 4, the stacked film of the first conductor 2 and the insulator 3 is processed to be the stacked film of the first electrode (the gate electrode) and the first insulator (the gate insulator) (the cross-sectional view: FIG. 20A, the plane view: FIG. 20B).

(4) The second conductor is formed for connecting the transistors.

Figure 21A:
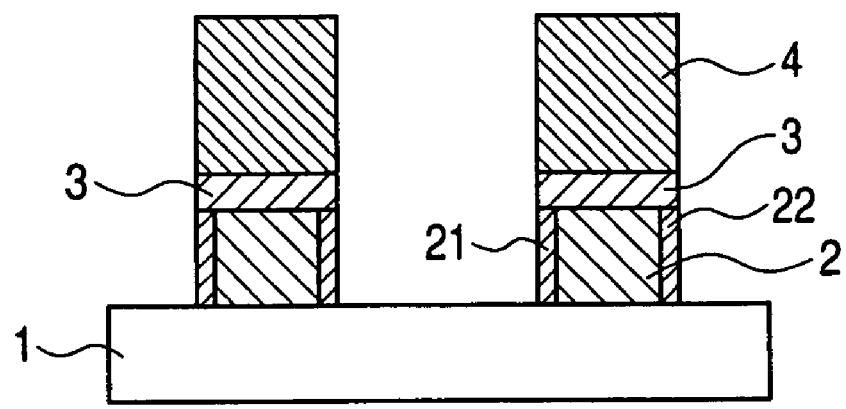
FIG. 21A is a cross-sectional view at the line A-A' in the plane view of FIG. 21B illustrating in order of a manufacturing process of the wiring substrate of the third embodiment of the present invention.
Figure 21B:
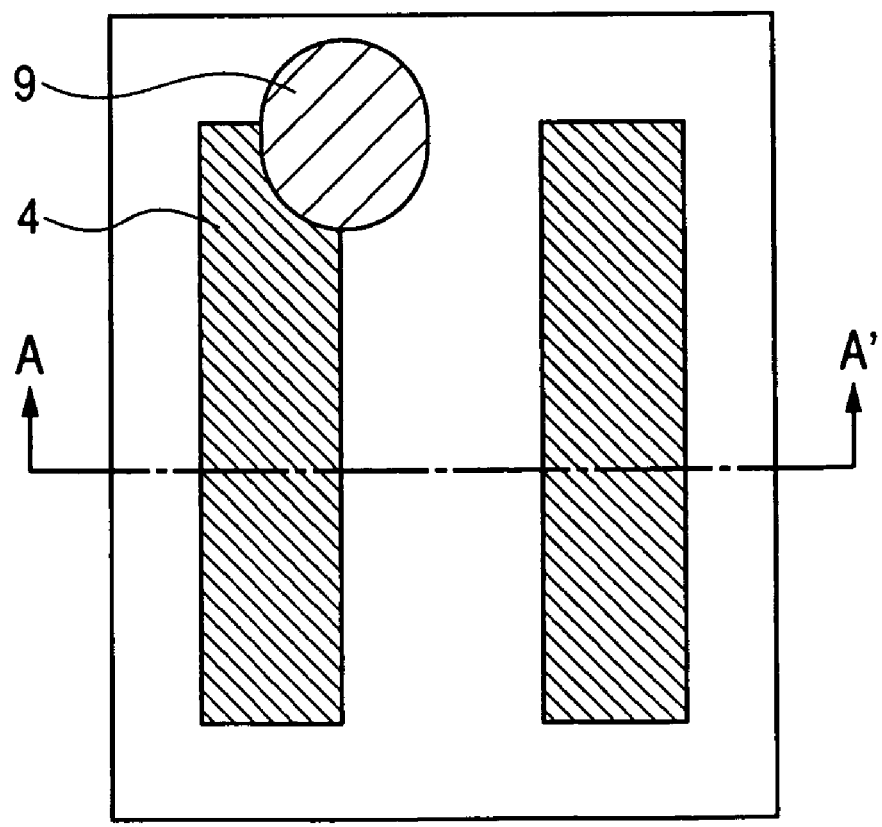
FIG. 21B is a plane view illustrating in order of a manufacturing process of the wiring substrate of the third embodiment of the present invention.
Figure 24A:
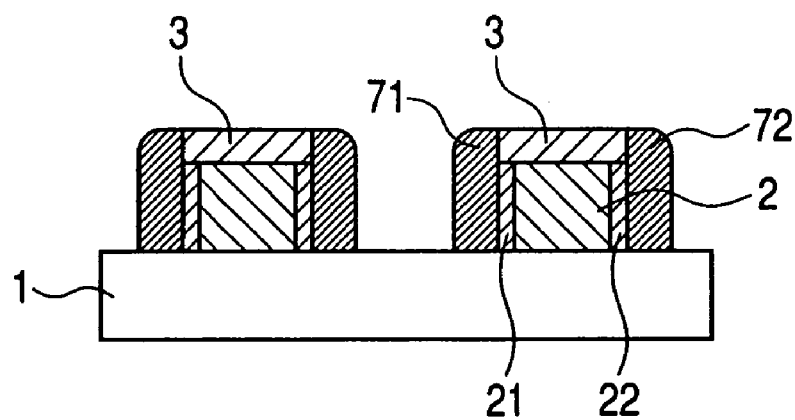
FIG. 24A is a cross-sectional view at the line A-A' in the plane view of FIG. 23B illustrating in order of a manufacturing process of the wiring substrate of the third embodiment of the present invention.
Figure 24B:
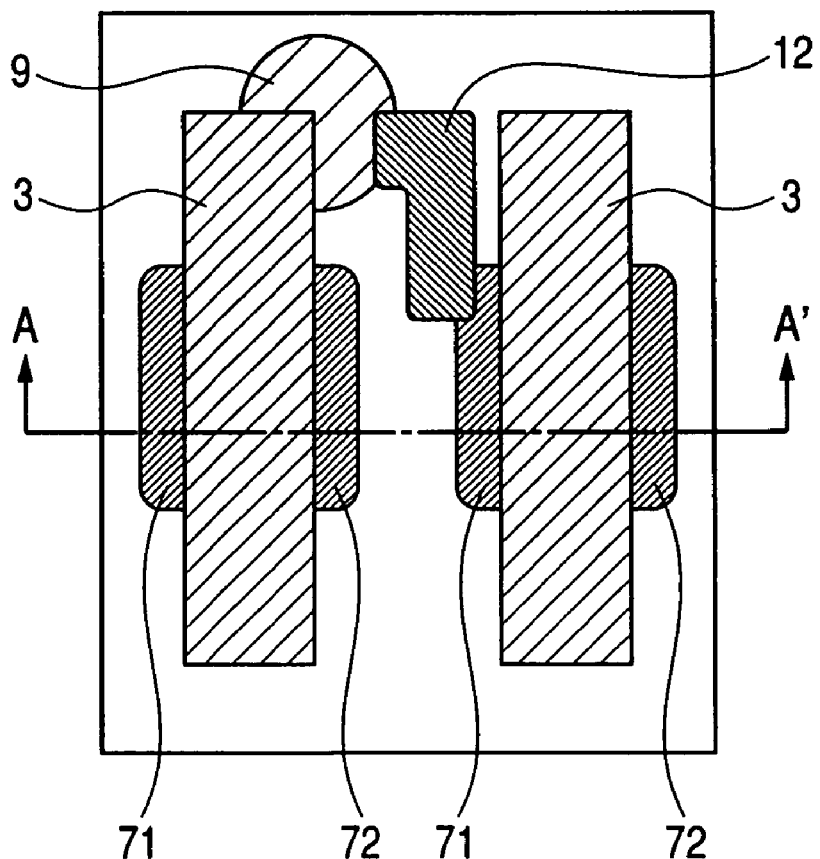
FIG. 24B is a plane view illustrating in order of a manufacturing process of the wiring substrate of the third embodiment of the present invention.

That is, in this embodiment, the fourth conductor (connection assist pattern) 9 is formed by using a gold nano-particle solution as shown in FIG. 20B in order to connect two transistors. In the case of gold, it is not anodized, so that the surface remains metallic when the gate sidewall is anodized (FIGS. 21A and 21B). Therefore, it may be used as the lead electrode from the gate when two transistors shown in FIGS. 24A and 24B are connected. The formation technique of the second conductive layer is the same as the formation technique of the aforementioned first conductive layer and it is sufficient. Moreover, Au, Ag, Cu, Pt, Ni, and Pd are listed as a metallic material which is not anodized and fine particle solutions of these metals can be used for the same purpose. Furthermore, as mentioned above, a conductive polymer solution containing these metals may be used. In addition, the shape of the top face of the second conductor is oval. However, it is needless to say that the shape is not intended to be limited to this.

(5) The second insulators 21 and 22 are formed over a pair of sidewalls opposite the first electrode 2 (FIGS. 21A and 21B). In this example, the first electrode 2 is formed by anodization.

Figure 22A:
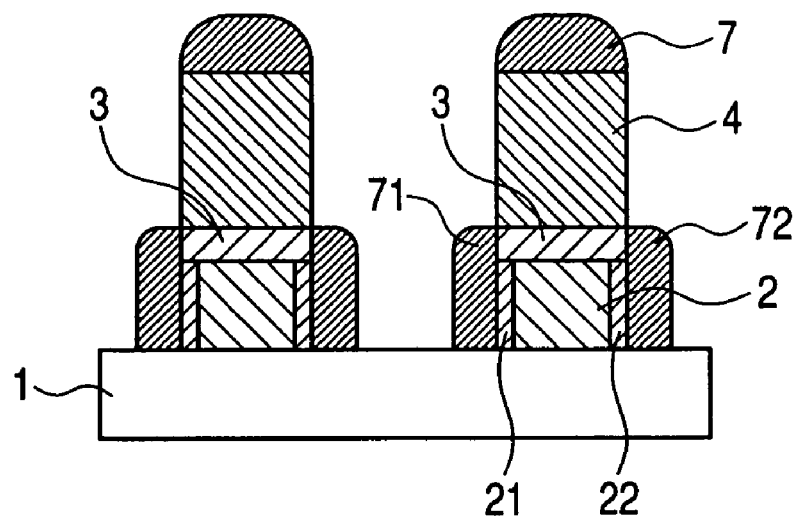
FIG. 22A is a cross-sectional view at the line A-A' in the plane view of FIG. 22B illustrating in order of a manufacturing process of the wiring substrate of the third embodiment of the present invention.
Figure 22B:
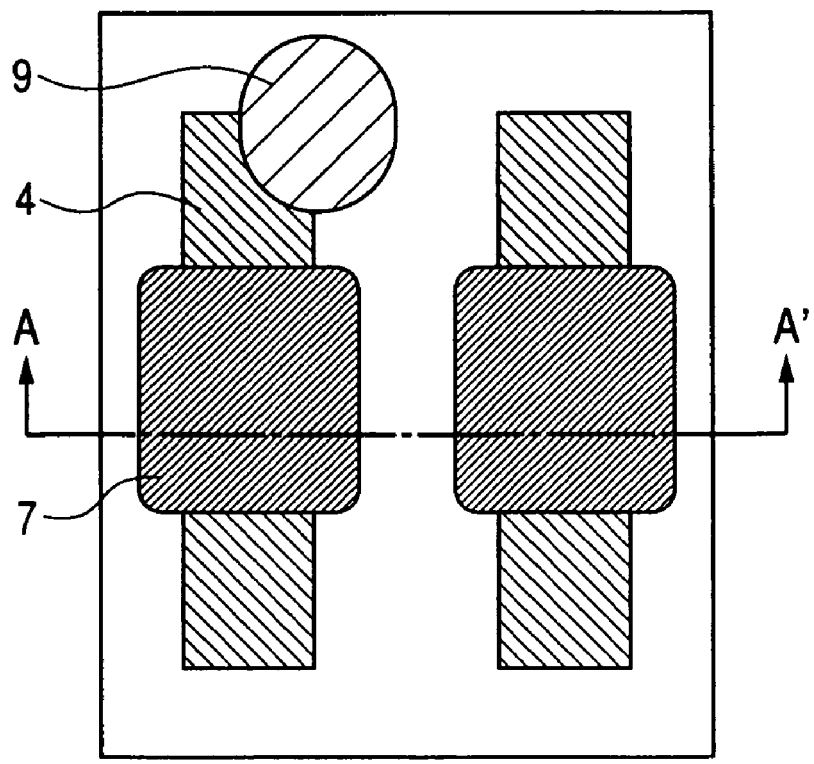
FIG. 22B is a plane view illustrating in order of a manufacturing process of the wiring substrate of the third embodiment of the present invention.

(6) The material for the second and third electrodes 7, 71 and 72 is coated over the second and third electrode regions and the first electrode pattern region (FIGS. 22A and 22B).

Figure 23A:
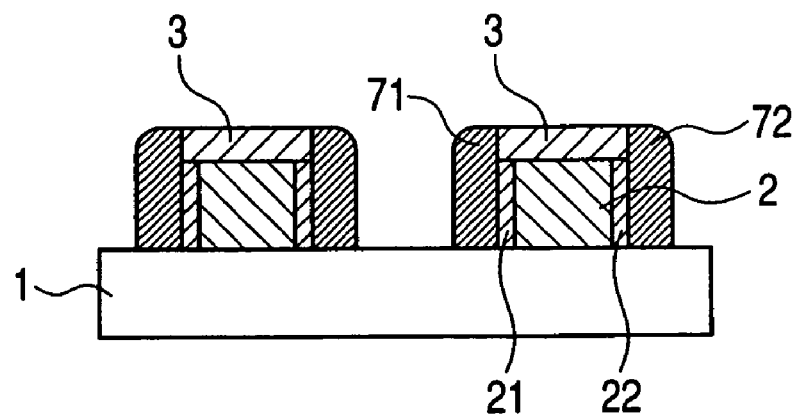
FIG. 23A is a cross-sectional view at the line A-A' in the plane view of FIG. 23B illustrating in order of a manufacturing process of the wiring substrate of the third embodiment of the present invention.
Figure 23B:
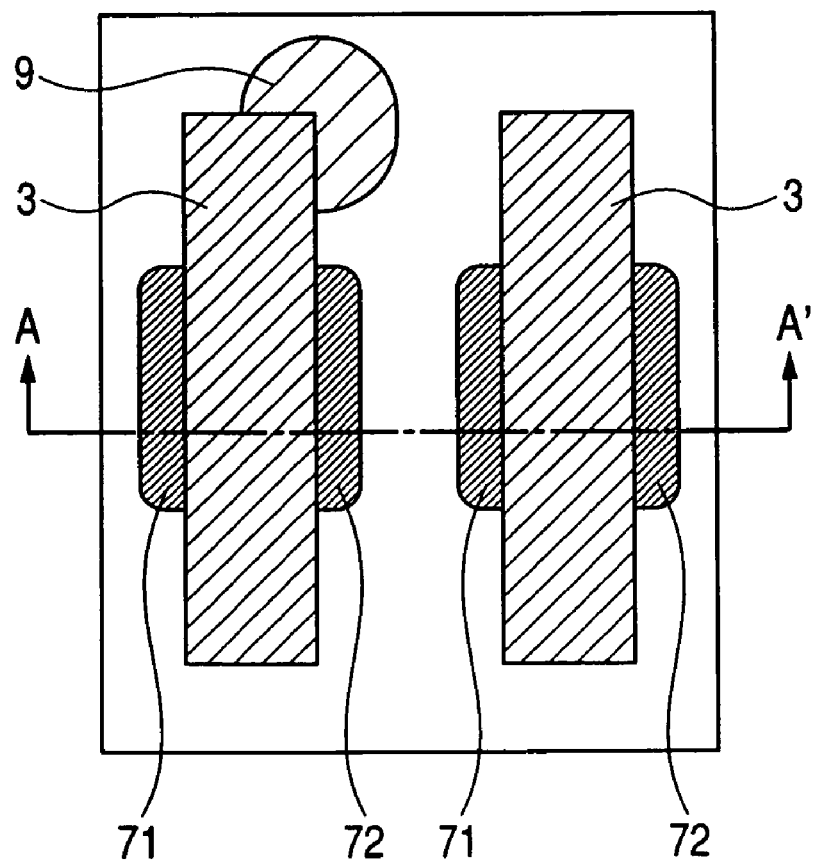
FIG. 23B is a plane view illustrating in order of a manufacturing process of the wiring substrate of the third embodiment of the present invention.

(7) The photoresist 4 at the upper part of the first electrode 2 is removed and the material for the second and third electrodes 7 over the first electrode is removed by lift-off. As a result, the second and third electrodes 71 and 72 were formed (FIGS. 23A and 23B). In this step, a part of the second conductor 9 is simultaneously removed. However, as a matter of course, the remaining second conductor 9 is connected to the conductor 2.

(8) The second conductor (connection assist pattern) 9 is lead from the gate electrode 2 of one transistor Tr1 and connected to the second (or third) electrode 71 of another transistor Tr2 by using the wiring 12 (FIGS. 24A and 24B).

Figure 25A:
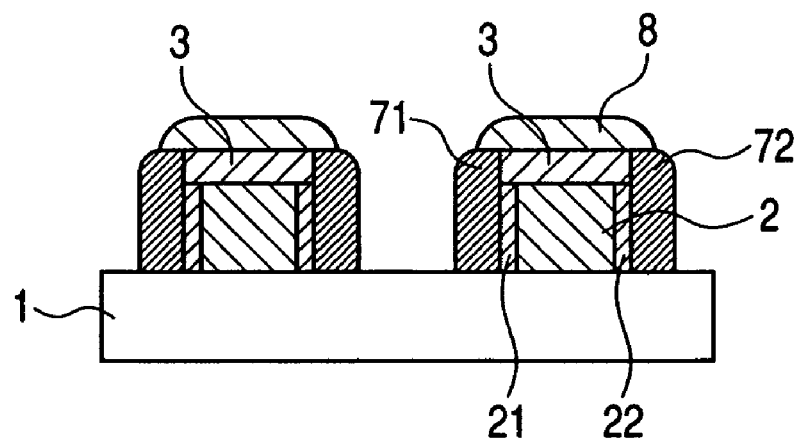
FIG. 25A is a cross-sectional view at the line A-A' in the plane view of FIG. 25B illustrating in order of a manufacturing process of the wiring substrate of the third embodiment of the present invention.
Figure 25B:
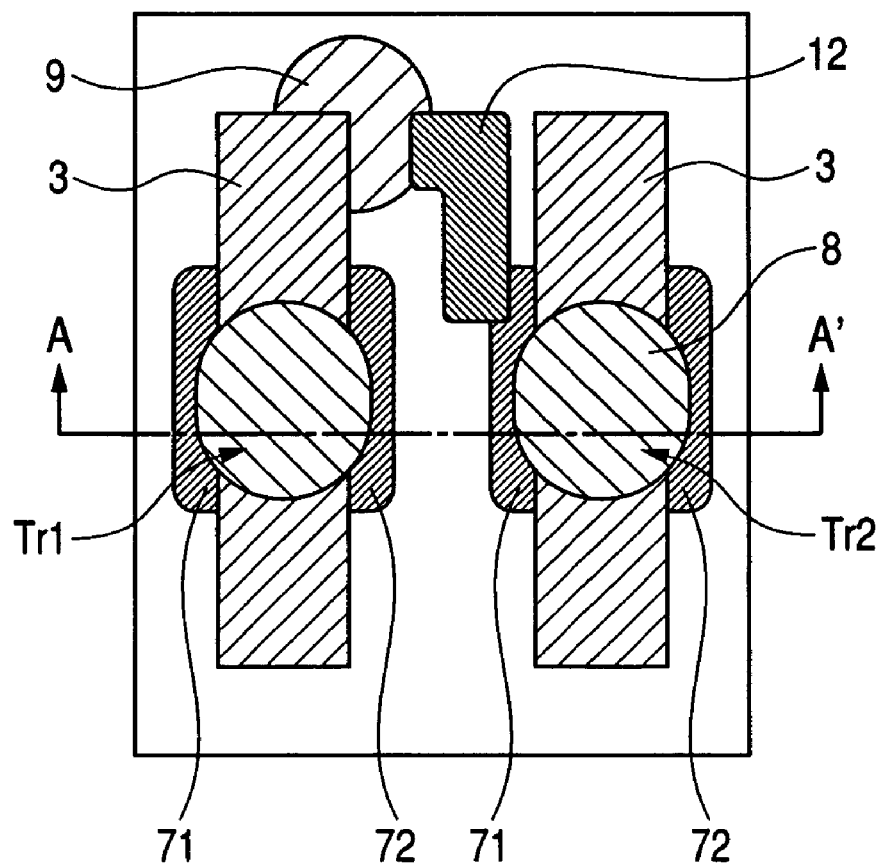
FIG. 25B is a plane view illustrating in order of a manufacturing process of the wiring substrate of the third embodiment of the present invention.

(9) The coatable semiconductor material layer 8 is coated between the second and third electrodes (between the source and drain electrodes) (FIGS. 25A and 25B).

Two transistors formed in this embodiment could be made to have the same mobility.

Even in the third embodiment, if various materials are changed in each part as described in the first embodiment, the objectives of the present invention are sufficiently achieved.

As mentioned above, the present invention has been described in detail. In the manufacturing process of an organic semiconductor, (1) a required material is drawn in a required area by the printing method, (2) the part of the first electrode and the second and third electrodes which must be aligned is formed by self-alignment to match the position of the first electrode and the second and third electrodes. Therefore, the electrode substrate, where the aforementioned three electrodes are precisely aligned through the insulator, can be formed by using a printing method. Additionally, if the printing method of the present invention is used, it is only required that the necessary material be used in the minimum area and it becomes possible for it to be manufactured only by using one photomask for the gate pattern. Therefore, the manufacturing cost can be drastically reduced.

In the present invention, since all steps can be formed at low temperature, the upper wiring/electrode can be formed aligning to the other electrode when the substrate is formed of a material, such as plastic, having flexibility and thermoplasticity where it can deformed by heat. Such a substrate is preferable to manufacture displays such as, for instance, flexible electronic paper.

As mentioned above, according to the aforementioned embodiments of the present invention, the process of alignment between the first electrode and a pair of second and third electrodes can be achieved only by using one photomask. Then, alignment is made possible between the gate electrode and the source-drain electrodes of the thin film field-effect modified transistor. Therefore, using the methods in the aforementioned embodiments, a field-effect modified thin film transistor using a semiconductor material which can be coated and printed can be provided. Moreover, the aforementioned embodiments makes it possible to use a flexible substrate from the viewpoint that a semiconductor material which can be coated and printed can be used.

Thus, the aforementioned embodiments of the present invention are useful to manufacture a semiconductor device where an organic thin film transistor, an oxide transistor, and a semiconductor material which can be coated or printed are included in the channel part.

Hereafter, if the main mode of the present invention is enumerated, it is as follows.

(1) A manufacturing method of a semiconductor device includes the steps of:

stacking a first conductor and a first insulator over a substrate, forming a photoresist film corresponding to a first electrode over the stacked film, processing the stacked film of the first conductor and the insulator to the stacked film of the first electrode and the first insulator by using the processed photoresist film, forming a second insulator over a pair of sidewalls of the first electrode, forming a second conductor (electrode material film) for the second and third electrodes by coating or printing over both sides of the second insulator formed over the pair of sidewalls, and over the stacked film of the first electrode and the first insulator, forming the second and third electrodes by removing the photoresist film over the first insulator and removing second conductor for the second and third electrodes over the first insulator, and forming a semiconductor film by coating or printing a coatable and printable semiconductor material, which touches the second and third electrodes and covers the first insulator.

(2) A manufacturing method of a semiconductor device according to the aforementioned (1) in which the first electrode is a gate electrode; the second and third electrodes are source and drain electrodes; the first insulator is a gate insulator.

(3) A manufacturing method of a semiconductor device according to the aforementioned (1) to (2), in which the step of stacking the first conductor and the insulator is one where the first conductor is formed by anodic oxidation.

(4) A manufacturing method of a semiconductor device according to the aforementioned (1) to (3), in which the step of forming the second insulator over a pair of sidewalls of the first electrode is one where a pair of sidewalls of the first electrode is formed by anodic oxidation.

(5) A manufacturing method of a semiconductor device according to the aforementioned (1), in which, in the step of forming the photoresist film corresponding to the first electrode over the stacked film, a plurality of the photoresist films corresponding to the first electrode are formed to be arranged in a matrix, in which the first electrode of each semiconductor device in the line or column arranged in the matrix is connected using the first conductor, in which, after the step of forming the second and third electrodes, a step is included where the second or third electrode of each semiconductor device in the line or column arranged in the matrix is connected using the third conductor, and in which a mode is included in which a plurality of the semiconductor devices are arranged in a matrix, consisting of a combination with the semiconductor device which touches the first electrode, the first insulator thereon, the second insulator formed over a pair of the first electrodes, and the second and third electrodes provided ever both sides, and which is provided to cover the first insulation film.

(6) A manufacturing method of a semiconductor device according to the aforementioned (1), in which, in the step of forming the photoresist film corresponding to the first electrode over the stacked film, at least two of the photoresist films corresponding to the first electrode are formed to be arranged in a matrix, in which, after the step of processing the stacked film of the first electrode and the first insulator, the process of forming the fourth conductor connected to the stacked film of the first semiconductor device of the two semiconductor devices is included, in which, after the step of forming the second and third electrodes, the step of forming the fourth conductor connected to the first semiconductor device in the two semiconductor devices and the step of forming the fifth conductor connected to the second or third electrode of the second semiconductor device in the two semiconductor devices are included, in which a mode is formed in which at least two semiconductor devices are arranged in the matrix, consisting of a combination with the semiconductor device which touches the first electrode, the first insulator thereon, the second insulator formed over a pair of sides of the first electrode, and the second and third electrodes provided over the sides, and which is provided to cover the first insulator.

(7) A manufacturing method of a semiconductor device according to the aforementioned (6), in which the formation of the fourth conductor is carried out by coating (coating method including printing). The fourth conductor is preferably a material which is not anodized.

(8) A manufacturing method of a semiconductor device according to the aforementioned (1) to (7), in which the semiconductor material which is coated (coating method including printing) is an organic semiconductor.

(9) A manufacturing method of a semiconductor device according to the aforementioned (1) to (7), in which the semiconductor material which is coated or printed is an oxide semiconductor.

(10) A manufacturing method of a semiconductor device according to the aforementioned (1) to (7), in which the semiconductor material which is coated (coating method including printing) is a silicon-containing semiconductor.

(11) A manufacturing method of a semiconductor device according to the aforementioned (1) to (7), in which the coating method (coating including printing) uses one or a plurality of kinds selected from an inkjet method, a microdispensing method, a transfer method, a screen coating and printing method, a slit coating method, a spray coating method, a capillary coating method, a dip-coating method, and a spin-coating method.

What is claimed is:

1. A manufacturing method of a semiconductor device comprising the steps of:
   stacking a first conductor and a first insulator over a substrate;
   forming a photoresist film corresponding to a first electrode over the stacked film;
   processing the stacked film of the first conductor and the first insulator to the stacked film of the first electrode and the first insulator by using the processed photoresist film;
   forming a second insulator over a pair of sidewalls of the first electrode;
   forming a second conductor for the second and third electrodes by coating over the sides of the second insulator formed over the pair of sidewalls, and over the stacked film of the first electrode and the first insulator;
   forming the second and third electrodes by removing the photoresist film over the first insulator and removing the second conductor for the second and third electrodes over the first insulator; and
   forming a semiconductor film which touches the second and third electrodes and covers the first insulator by coating a semiconductor material.

2. A manufacturing method of a semiconductor device according to claim 1, wherein
   the step of stacking the first conductor and the first insulator is one where the first conductor is formed by anodic oxidation.

3. A manufacturing method of a semiconductor device according to claim 1, wherein
   the step of forming the second insulator over a pair of sidewalls of the first electrode is one where a pair of sidewalls of the first electrode is formed by anodic oxidation.

4. A manufacturing method of a semiconductor device according to claim 1, wherein
   the semiconductor material to be coated is an organic semiconductor.

5. A manufacturing method of semiconductor device according to claim 1, wherein
   the semiconductor material to be coated is an oxide semiconductor.

6. A manufacturing method of semiconductor device according to claim 1, wherein the semiconductor material to be coated is a silicon-containing semiconductor.

7. A manufacturing method of a semiconductor device according to claim 1, wherein
the step of coating the semiconductor material is one or a plurality of kinds selected from an inkjet method, a micro-dispensing method, a transfer method, a screen coating-printing method, a slit coating method, a spray coating method, a capillary coating method, a dip-coating method, and a spin-coating method.

8. A manufacturing method of a semiconductor device according to claim 1, wherein
the first electrode is a gate electrode, the second and third electrodes are, a source and a drain electrodes, respectively, and the first insulator is a gate insulator.

9. A manufacturing method of a semiconductor device according to claim 8, wherein
the step of stacking the first conductor and the first insulator is one where the first conductor is formed by anodic oxidation.

10. A manufacturing method of a semiconductor device according to claim 8, wherein
the step of forming the second insulator over a pair of sidewalls of the first electrode is one where a pair of sidewalls of the first electrode is formed by anodic oxidation.

11. A manufacturing method of a semiconductor device according to claim 8, wherein
the semiconductor material to be coated is an organic semiconductor.

12. A manufacturing method of a semiconductor device according to claim 8, wherein
the semiconductor material to be coated is an oxide semiconductor.

13. A manufacturing method of a semiconductor device according to claim 8, wherein
the semiconductor material to be coated is a silicon-containing semiconductor.

14. A manufacturing method of a semiconductor device according to claim 8, wherein
the step of coating the semiconductor material is one or a plurality of kinds selected from an inkjet method, a micro-dispensing method, a transfer method, a screen coating-printing method, a slit coating method, a spray coating method, a capillary coating method, a dip-coating method, and a spin-coating method.

15. A manufacturing method of a semiconductor device according to claim 1,
wherein, in the step of forming the photoresist film corresponding to the first electrode over the stacked film, a plurality of the photoresist films corresponding to the first electrode are formed to be arranged in a matrix,
wherein, the first electrode of each semiconductor device in the line or column arranged in the matrix is connected with the first conductor,
wherein, after the step of forming the second and third electrodes, a step is included where the second or third electrode of each semiconductor device in the line or column arranged in the matrix is connected by using the third conductor, and
wherein a mode is formed in which a plurality of the semiconductor devices are arranged in the matrix, consisting of a combination of the first electrode, the first insulator thereon, the second insulator formed over a pair of sides of the first electrodes, and the second and third electrodes provided over the sides, and the semiconductor film which touches the second and third electrodes and is provided to cover the first insulator.

16. A manufacturing method of a semiconductor device according to claim 1,
wherein, in the step of forming the photoresist film corresponding to the first electrode over the stacked film, at least two of the photoresist films corresponding to the first electrode are arranged,
wherein, after the step of processing the stacked film of the first electrode and the first insulator, the process of forming the fourth conductor connected to the stacked film of the first semiconductor device of the two semiconductor devices is included,
wherein, after the step of forming the second and third electrodes, the step of forming the fourth conductor connected to the first semiconductor device in the two semiconductor devices and the step of forming the fifth conductor connected to the second or third electrode of the second semiconductor device in the two semiconductor devices are included,
wherein a mode is formed in which at least two semiconductor devices are arranged, consisting of a combination of the first electrode, the first insulator thereon, the second insulator formed over a pair of sides of the first electrode, and the second and third electrodes provided over the sides, and the semiconductor film which touches the second and third electrodes and is provided to cover the first insulator.

17. A manufacturing process of a semiconductor device according to claim 16, wherein
the formation of the fourth conductor is carried out by coating.

* * * * *